United States Patent

Nishikawa

[19]

[11] Patent Number: 5,971,596
[45] Date of Patent: Oct. 26, 1999

[54] CONSTRAINT CONDITION EVALUATION METHOD AND CONSTRAINT CONDITION EVALUATION SYSTEM

[75] Inventor: Takeichiro Nishikawa, Kanagawa-ken, Japan

[73] Assignee: Kabushiki Kaisha Toshiba, Kawasaki, Japan

[21] Appl. No.: 08/663,699

[22] Filed: Jun. 14, 1996

[30] Foreign Application Priority Data

Jun. 16, 1995 [JP] Japan .................................. 7-150600

[51] Int. Cl.$^6$ ............................. G06F 17/00; G06F 17/50
[52] U.S. Cl. ......................... 364/489; 364/488; 364/490; 364/491
[58] Field of Search ..................................... 364/488–491

[56] References Cited

U.S. PATENT DOCUMENTS

| | | | |
|---|---|---|---|
| 5,450,535 | 9/1995 | North ...................................... | 395/140 |
| 5,452,238 | 9/1995 | Kramer et al. .......................... | 364/578 |
| 5,568,396 | 10/1996 | Bamji et al. ............................ | 364/491 |
| 5,581,474 | 12/1996 | Bamji et al. ............................ | 364/490 |

OTHER PUBLICATIONS

James Do et al., "Spacer II: A Well–Behaved IC Layout Compactor," *IFIP*, pp. 282–291 (1986).
Y. Eric Cho, "A Subjective Review of Compaction," *IEEE*, pp. 396–404 (1985).
Yuh–Zen Lioa et al., "An Algorithim to Compact a VLSI Symbolic Layout with Mixed constraints," *IEEE*, pp. 62–62–69 (1983).
A.V. Aho et al., "Data Structure and Algorithim," Baifukan Publishing Co., p. 195, Sec. 6 & 7. No date.
Masao Iri, et al., "Graph Theory Exercise", Corona Publishing Co., p. 4. No date.
Kiyoshi Ishihata, "Algorithm and Data Structure", Iwanami Software Science Series, pp. 242–244. No date.
Reference 4—no translation—A larger set of vertexes in a directed graph, in which paths exist from every vertex to all others, is called strongly–connected component in the directed graph, p. 195, section 6.7, first paragraph, lines 2–3. No date.
Reference 5—no translation—The removal of an edge k∈E from the graph G=(V, E), with the both ends remaining in the graph, is called removal processing (deletion) of edge k, and this makes a partial graph G'=(V, E−{l}), p. 4, lines 12–14. No date.
Reference 7—no translation—Such an order relationship in which two elements may be incomparable with each other, is called partial order (partial order). If $a_i<a_j$ and $a_j<a_k$, then $a_i<a_k$ is valid (transitive rule). The problem is how to charge the order of a plurality of given data so as to be consistent with a predetermined partial order. This is called topological sort (topological sort), p. 242, fourth line from the bottom to p. 243, line 2. No date.
K. Ishima et al., "On an Algorithm to Detect Positive Cycles in a Constraint Graph for Layout Compaction", IEICE Transactions, E 74(11):3613–3616 (1991).

*Primary Examiner*—Kevin J. Teska
*Assistant Examiner*—Vuthe Siek
*Attorney, Agent, or Firm*—Finnegan, Henderson, Farabow, Garrett & Dunner, L.L.P.

[57] ABSTRACT

It is an object of this invention is to provide a constraint condition evaluation method and a constraint condition evaluation system which detect PCs speedily in a constraint graph in a large system. To achieve this object, the system has the disassembling means (3) which disassembles a constraint graph, representing the constraints in the layout of components, into a plurality of subgraphs according to a specific division method while retaining the cycles in the constraint graph, the back edge detecting means (4) which detects back edges in each subgraph, and the PC detecting means (5) which detects PCs associated with the back edge in each subgraph. The system disassembles a constraint graph into smaller subgraphs to prevent the processing time increase rate from increasing, and reduces the PC detection time.

28 Claims, 14 Drawing Sheets

CONSTRAINT CONDITION EVALUATION METHOD AND CONSTRAINT CONDITION EVALUATION SYSTEM

BACKGROUND OF THE INVENTION

This invention relates to an improvement in a constraint condition evaluation method and a constraint condition evaluation system which check if there is a conflict in the constraint conditions in the layout of components such as those on an IC.

When component layouts in ICs and others must be modified under some given constraints, one known method: is used; in that method, the constraint conditions are represented by a directed graph called constraint graph and, based on this graph, the check is made to see if there are conflicts in the constraint conditions. FIG. 14 shows an example of a constraint graph. As shown in this figure, a constraint graph, usually composed of edges connecting a plurality of vertexes (v), starts with a initial vertex called a source and ends with an terminal vertex called a sink. In this figure, a vertex is represented by a circle-shaped symbol, and an edge by an arrow-shaped symbol.

In a constraint graph, there are paths from the source to other vertexes. Each vertex usually represents the base point of a component to be laid out, and the position of the vertex X(v) represents the position of the base point of each component to be laid out. An edge between two vertexes has a numeric value called a weight. The weight of each edge represents an necessary interval or space required for both base points between elements to be laid out.

For example, FIG. 15 is an example of component layout corresponding to the constraint graph in FIG. 14. This figure shows how components A, B, and C are laid out along the X axis. The constraint condition in this example is that a space of 2 or larger is required between each two components.

The positions of components A, B, and C are represented by X(va), X(vb), and X(vc), respectively, based on the leftmost points, va, vb, and vc. FIG. 15 corresponds to the constraint condition. More specifically, the weight of 13 between vertexes va and vb indicates that the total width of 13, consisting of the width (11) of a part of component A and the space of 2, is required between the left end of component A and the left end of component B. Similarly, the weight of 12 between vertexes vb and vc indicates that the total width of 12, consisting of the width (10) of component B and the space of 2, is required between the left end of component B and left end of component. C.

A constraint graph normally contains a back edge whose initial vertex is smaller than that of the terminal vertex. Typically, a back edge has a negative weight. In FIG. 14, a back edge goes from vertex vc to vertex va, and the weight of −22 of this back edge indicates that the left end of component A is at most 22 left of the left end of component C. This is because the distance from the left end of component A to the right end of break of component A where component C is to be placed is 32 (11+21) and because the component C requires the length of 10 consisting of the width of 8 and the space of 2 on the right side. As a result, only the length of 22 is allowed.

In general, when the edge $e\ \mu\ v$ is directed from the first vertex $v\ \mu$ to the second vertex $v\ v$ and when the edge $e\ \mu\ v$ has the weight of $W(e\ \mu\ v)$, the position $X(v\ v)$ of point $v\ v$ must be placed at least $W(e\ \mu\ v)$ positions right of $X(v\ \mu)$. This relationship is represented by the following formula:

[Formula 1]

$$X(v\ v) \geq X(v\ \mu) + W(e\ \mu\ v)$$

A constraint graph usually contains a cycle. A cycle, whose paths can be followed in the direction, has at least one back edge. The weight of a back edge indicates an space within which each component is to be placed. If the sum of the weights of the paths going from the terminal vertex of a back edge to the initial vertex is not superior to the weight of the back edge, each component may be placed within the space indicated by the back edge. Here, the sum of the weights of the paths going from the terminal vertex of a back edge to the initial vertex does not exceed the weight of the back edge, means the sum of the weight of the cycle is negative. Of course, when the sign of each weight is reversed, the sum is positive.

If the sum of the weights of the forward edges does not exceed the weight of the back edge or not is determined simply by adding up all the weights in the cycle. If the result is positive, the cycle is called a Positive Cycle (PC) and it is known that there is no solution for the constraint indicated by the PC (Reference 1: Y. E. Cho: A Subjective Review of Compaction, Proc. 22nd Design Automation Conference, 1985, pp. 396–404../Reference 2: K. Ishima, S. Tsukiyama: On an Algorithm to Detect Positive Cycle in a Constraint Graph for Layout Compaction, IEICE Trans. Vol. E 74, No. 11 November 1991, pp. 3613–3616).

For example, in FIG. 15, the width of said break is 21 and components B and C require the total width 24 of width of themselves 10+8=18 and spaces 2×3=6. Then break width is 3 less than the required width, therefore, it is impossible to lay out the components so that they satisfy the condition. This is confirmed simply by adding up the weights contained in the cycle on the constraint graph without having to lay out components. That is, in FIG. 14, because the sum of the weights contained in the cycle is calculated as

[Formula 2]

$$13+12-22=3>0$$

and because this cycle is PC and the space is 3 less than the desired value, it is determined that there is no solution that satisfies the constraint condition.

Such a PC in a constraint graph must be dissolved and removed from the graph prior to the layout operation. The evaluation of a conflict in a constraint graph means to detect and remove such a PC. Detecting a PC with the use of a constraint graph is especially advantageous when the components relationship becomes complicated as the number and types of components increase.

The following is an example in which a PC is detected in a constraint graph. First, this method sorts the vertexes according to some criteria. Because a back edge is defined as an edge whose initial vertex is larger than the terminal vertex in the sort sequence, at least one edge is a back edge in a cycle. In particular, when the vertexes are sorted in ascending order according to their positions X(v), the number of back edges b is much less than the total number of edges in the graph. Therefore, investigating only the paths containing back edges efficiently finds cycles in a constraint graph.

In a prior art, this is used to reduce the time to detect PCs (Reference 2 shown above/Reference 3: J. Do, W. Dawson: SPACER II: A Well Behaved IC layout Compactor, Proceedings of VLSI 85 International Conference, 1985.).

This method is described more in detail. First, all back edges fi (i=1, . . . b) are removed from the constraint graph G, and the resulting back-edge-removed graph is defined as G0.

[Formula 3]

$$G0 = G - \{f1, f2, \ldots, fb\}$$

If G0 is unconnected, a minimum number of back edges are added to form G0, and added back edges are removed from the back edge set. Note that, when the back edge set is null (b=0), there is no PC in the constraint graph, so this method immediately ends processing.

Starting from the back-edge-removed graph G0, this method repeats the following processing for each back edge fi in order of i=1, . . . , b. First, the method adds the back edge fi to the graph Gi−1 to form the graph Gi−1+fi and, from this graph, detects a PC. When a PC is detected, the method records it in the specified memory area. Then it removes the back edge fi from the graph Gi−1+fi again to form the graph Gi−1 and regards the graph Gi−1 as the next graph Gi for use in the next back edge processing. On the other hand, when the back edge fi is added but no PC is detected, this method uses the graph Gi−1+fi as Gi, with the back edge fi still added, for the next back edge processing.

In repeating the above procedure, the initial graph G0 contains no PC because it contains no back edge. When the PC is detected in the graph Gi−1+fi, the back edge fi is re-detected. Therefore, the next graph Gi that is used for the next back edge fi+1 also contains no PC. After this procedure is repeated, all the detected PCs are recorded in the specified memory area. A resultant graph Gb becomes the constraint graph G from which all the back edges constituting the PCs have been removed.

If no PC was found while the procedure for each back edge fi (i=1, . . . , b) was repeated, all the back edges fi are added again to the back-edge-removed graph G0 and, therefore, Gb=G0.

FIG. 16 is a flowchart showing an example in which PCs are detected according to the prior art. For the graph Gi at a given vertex, the longest path length between two vertexes, v μ and v ν, in the graph Gi is represented as Li (v μ, v ν). Among them, the longest path length from the source to the vertex v μ is represented as Li (v μ).

In the processing shown in FIG. 16, the procedure finds the longest path length L0 (v λ) from the source to a vertex v λ in the back-edge-removed graph G0 (step 151). Next, the procedure sequentially selects all the back edges fi (i=1, . . . , b) while incrementing i from 1 to b (steps 152 and 153) and does the following processing for each back edge fi. In the following discussion, the initial vertex of the back edge fi is defined as v μ, and the terminal vertex as v ν.

First, the procedure determines that the back edge fi does not form a PC if the difference between the longest path length Li−1 (v ν) from the source to the terminal vertex v ν of the back edge fi and the longest path length Li−1 (v μ) from the source to the initial vertex v μ of the back edge fi does not exceed the weight W(Fi) of the back edge fi (step 154). That is, if the following is satisfied,

[Formula 4]

$$Li-1(v\ v) \geq Li-1(v\ \mu) + W(fi)$$

then, the back edge fi does not form a PC.

Theoretically, it is simple to determine whether or not a PC is formed, using the relationship between the longest path length Li−1 (v μ, v ν) from initial vertex v μ to the terminal vertex v ν and the weight W(fi) of the back edge fi. The following formula is used to determine whether or not a PC is formed:

[Formula 5]

$$0 \geq Li-1(v\ v, v\ \mu) + W(fi)$$

Here, it should be noted that the longest path length Li−1 (v μ) from the source to the initial vertex v μ is equal to or larger than the sum of the longest path length Li−1 (v ν) from the source to the terminal vertex v ν and the longest path length Li−1 (v ν, v μ) from the terminal vertex v ν to the initial vertex v μ.

[Formula 6]

$$Li-1(v\ \mu) \geq Li-1(v\ v) + Li-1(v\ v, v\ \mu)$$

By transposing the formula;

[Formula 7]

$$Li-1(v\ \mu) - Li-1(v\ v) \geq Li-1(v\ v, v\ \mu)$$

By transposing formula 4;

[Formula 8]

$$0 \geq Li-1(v\ \mu) - Li-1(v\ v) + W(fi)$$

In the above formula, Li−1(v μ)−Li−1(v ν) may be replaced by the left hand side of formula 7. This results in formula 5, meaning that formula 4 may be used to determine whether or not a PC is present. So, using the difference between the longest path length Li−1 (v ν) from source to the terminal vertex v ν of the back edge fi and the longest path length Li−1(v μ) from the source to the initial vertex V μ of the back edge fi eliminates the need to find the longest path length Li−1 (v ν, v μ) between the initial vertex v μ and the terminal vertex v ν of the back edge fi. This speeds up processing.

In step 154, if the back edge fi does not form a PC, the procedure uses the following formula by adding the back edge fi to the graph (step 155):

[Formula 9]

$$Gi = Gi-1 + fi$$

The longest path length Li−1 (v λ) from the source to any given vertex v λ is the same. So, the longest path length Li−1 (v λ) is used also for the processing of the next back edge fi+1.

[Formula 10]

$$Li(v\ \lambda) = Li-1(v\ \lambda)$$

Then, the next back edge is selected (step 152).

On the other hand, in step 154, if

[Formula 11]

$$Li-1(v\ v) < Li-1(v\ \mu) + W(fi)$$

then a check is made to see if the terminal vertex v ν is on the longest path from the source to the initial vertex v μ (step 156). If the terminal vertex v ν is on the longest path from the source to the initial vertex v μ, the sum of the back edge fi and the path from the terminal vertex v ν to the initial vertex v μ form a PC. So, they are recorded as a PC (step 157). In this case, the procedure keeps the graph and the positions of the vertexes unchanged:
[Formula 12]

$$Gi=Gi-1$$

$$Li(v\ \lambda)=Li-1(v\ \lambda)$$

and selects the next back edge (step 152).

If, in step 156, the terminal vertex v ν is not on the longest path from the source to the initial vertex v μ, the procedure goes to the step 158 and the following steps. That is, for all the vertexes v λ to which the paths from the terminal vertex v ν in the graph exist, the procedure finds the longest path length Li-1 (v ν, v λ) from the terminal vertex v ν of the back edge (step 158). And if there is a path from this terminal vertex v ν to the initial vertex v μ, and if Li-1(v ν, v μ) is larger than the weight W (fi) of the back edge, that is, if
[Formula 13]

$$Li-1(v\ \nu,\ v\ \mu)+W(fi)\geq 0$$

then (step 159), the sum of the longest path from the terminal vertex v ν to the initial vertex v μ and the back edge fi is recorded as a PC (step 157). And, the procedure keeps the graph and the positions of the vertexes unchanged:
[Formula 14]

$$Gi=Gi-1$$

$$Li(v\ \lambda)=Li-1(v\ \lambda)$$

and selects the next (i=i+1) back edge (step 152).

On the other hand, in step 159, if the longest path length Li-1 (v ν, v μ) does not exceed the weight W (fi) of the back edge,
[Formula 15]

$$Li-1(v\ \nu,\ v\ \mu)+W(fi)\leq 0$$

or if there is no path from the terminal vertex v ν to the initial vertex v μ, the back edge fi does not form a PC. In this case, the procedure adds the back edge fi to the graph (step 1510):
[Formula 16]

$$Gi=Gi-1+fi$$

As the result, a path which is through the added back edge becomes new one of paths from the source to each vertex. Thus, the longest path length from the source to each vertex is updated (step 1511). That is, a check is made to see if the longest path length via the added back edge is larger than the longest path length Li of the path from the source to each vertex. If the former is larger than the latter, the longest path length is replaced.

The longest path length of the path from the source via the back edge to each vertex v λ is calculated by adding the weight W (fi) of the back edge and the longest path length Li-1 (v ν, v λ) of the path from the terminal vertex v ν of the back edge to the vertex v λ to the longest path length Li-1(v μ) of the path from the source to the initial vertex v μ of the back edge fi. That is,

[Formula 17]

$$Li-1(v\ \mu)+W(fi)+Li-1(v\ \nu,\ v\ \lambda)$$

Let this be Li-1 X, and let max 0 be a function which returns the maximum value, then said replacement is represented:
[Formula 18]

$$Li(v\ \lambda)=\max(Li-1(v\ \lambda),\ Li-1\ X)$$

Then, the procedure selects the next (i=i+1) back edge (step 152). In finding the longest path length Li (v) and Li (v ν, v μ), the Dijkstra algorithm speeds up the processing.

To efficiently detect a PC, the procedure in FIG. 16 uses the difference between the longest path length Li-1 (v ν) of the path from the source to the terminal vertex v ν of the back edge fi and the longest path length Li-1(v μ) of the path from the source to the initial vertex v μ of the back edge fi. We can also use only the longest path length Li-1 (v ν, v μ) of the path from the initial vertex v μ of the back edge fi to the terminal vertex v ν in order to detect a PC.

According to the prior art, most of the processing time is used for the calculation of longest paths. Because the calculation time of the longest path is O (n log n), the time needed for detecting a PC is O (bn log n). And, the number of back edges is generally proportional to the number of vertexes in the graph, meaning that the execution time is O ($n^2$ log n) (See the Reference 1 described above). This indicates that the more and more time is required as the system scale becomes larger and larger. So, a constraint condition evaluation method and a constraint condition evaluation system which detect speedily the PCs in a constraint graph used in a large system have long been awaited.

This invention seeks to solve the problems associated with a prior art described above. It is an object of this invention to provide a constraint condition evaluation method and a constraint condition evaluation system which detect speedily the PCs in a constraint graph used in a large system.

SUMMARY OF THE INVENTION

In an embodiment of this invention, the system disassembles a given constraint graph into a plurality of subgraphs and detects PCs in each of them. In general, the PC detection time increases at a rate higher than O(n) for the number of components n in a constraint graph. The system of this embodiment disassembles a constraint graph into smaller subgraphs and so prevents the processing time increase rate from increasing and reduces the PC detection time. Because any cycle is not divided during division, all the PCs, each of which is a cycle, are always detected.

In another embodiment of this invention, the system detects back edges in a subgraph, calculates the longest path and the longest path length to detect a PC and, when a PC is present in the subgraph, removes the detected back edges, then further disassembles the subgraph to detect a PC. Thus, disassembling a subgraph further reduces the PC detection time, while still performing simple operation in which back edges are processed one at a time.

In a still another example of this invention, the system maintains an interval between two vertexes of an edge so that the weight of the edge is acceptable, making it easy to calculate the longest path length. Therefore, it also simplifies the composition and speeds up processing.

In a still another embodiment of this invention, a graph from which a back edge has been removed does not contain a cycle and is an acyclic graph which has been topologically-sorted. Therefore, by simply applying the first adjustment once to the vertexes in the sorted order, the positions of all the vertexes satisfy the constraints represented by the edges other than the removed back edges. The speed of PC detection is thus increased. In addition, if the vertexes are not converged even after the first adjustment and the second adjustment are repeated one time more than the number of back edges, it is determined that a PC is present. In general, the number of repetitions is smaller than the number of back edges.

Other and further objects, features and advantages of the invention will appear more fully from the following description.

Figure 1:
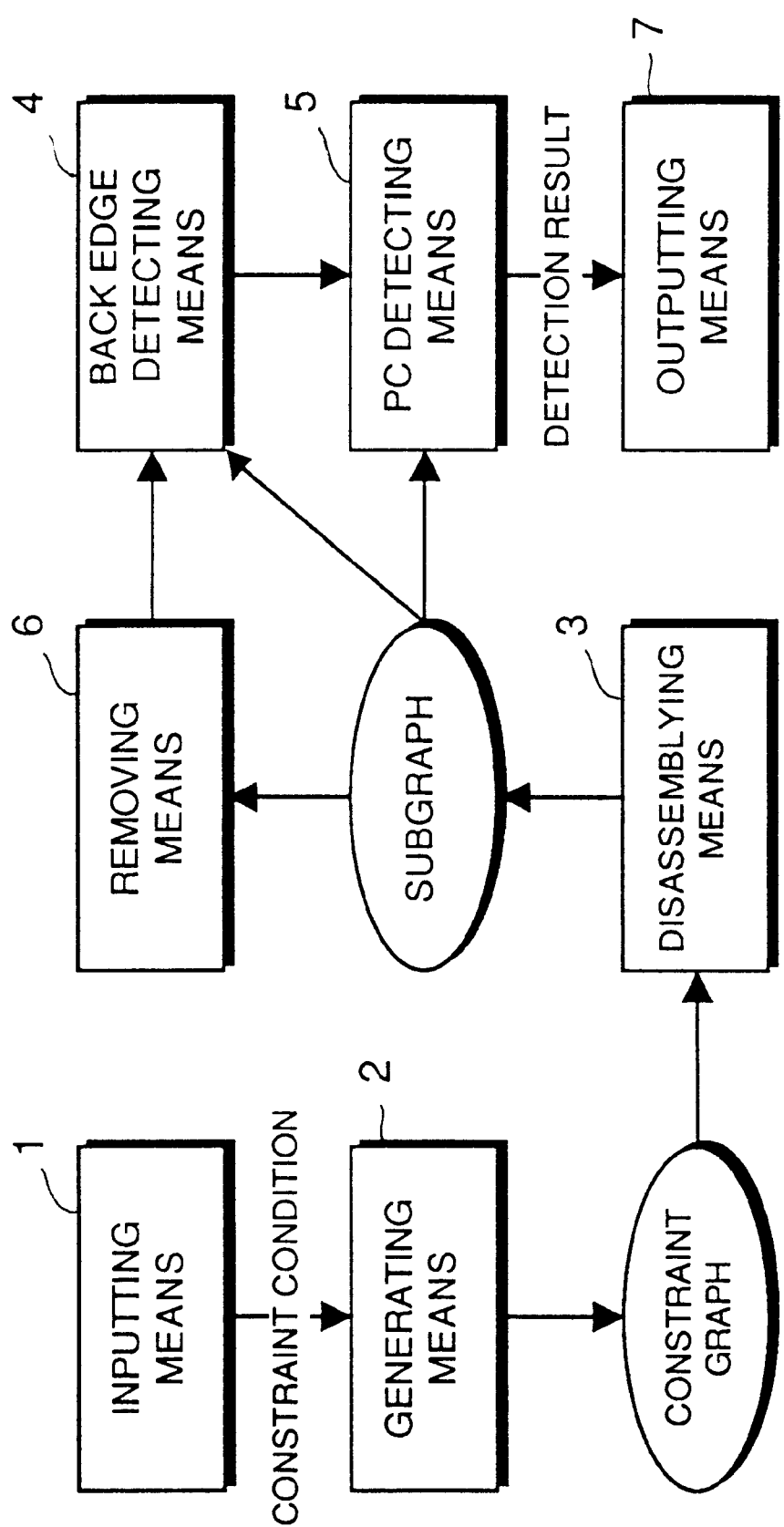
FIG. 1 is a block diagram showing the composition of the constraint condition evaluation system used in the first embodiment of this invention.

1 . . . Inputting means
2 . . . Generating means
3 . . . Disassembling means
4 . . . Back edge detecting means
5 . . . PC detecting mans
6 . . . Removing means
7 . . . Outputting means

EMBODIMENT

Referring to the attached drawings, there is shown a preferred embodiment of the present invention (hereafter called "embodiment"). Typically, this embodiment is implemented by a piece of software which controls a computer system including its peripheral devices. However, because there are many types of computer or software product, virtual circuit blocks, each corresponding to a function of the embodiment, are used in the following discussion.

(1) Configuration of the first embodiment

The first embodiment is a constraint condition evaluation method corresponding to claims 1, 2, 7 and 8 and constraint condition evaluation system which executes the constraint condition evaluation method (corresponding to claims 14, 15, 20 and 21). It is an object of this embodiment to provide a constraint condition evaluation method and constraint condition evaluation system which detect PCs in a large constraint graph speedily.

FIG. 1 is a functional block diagram showing the composition of the constraint condition evaluation system according to the first embodiment. As shown in this diagram, the constraint condition evaluation system (hereafter called "this system") according to the first embodiment has the inputting means 1 which receives a constraint condition for the layout of the components and the generating means 2 which generates a constraint graph based on the entered constraint condition. The constraint condition entered via the inputting means 1 includes all the information necessary for generating a constraint graph: component layout information, component composition information, component constraint condition, and design rules specified by parameters, determined by the materials or layers, specifying component composition, and others.

In addition, this system has the disassembling means 3 which disassembles a constraint graph into a plurality of subgraphs without dividing any cycle in the constraint graph, the back edge detecting means 4 which detects back edges in each subgraph, and the PC detecting means 5 which detects PCs associated with the back edges in each subgraph. This system also has the removing means 6 which removes a subgraph containing one vertex from the set of subgraphs from which PCs are detected, and the outputting means 7 which outputs PC detection results.

(2) Operation and benefits of the first embodiment

Figure 2:
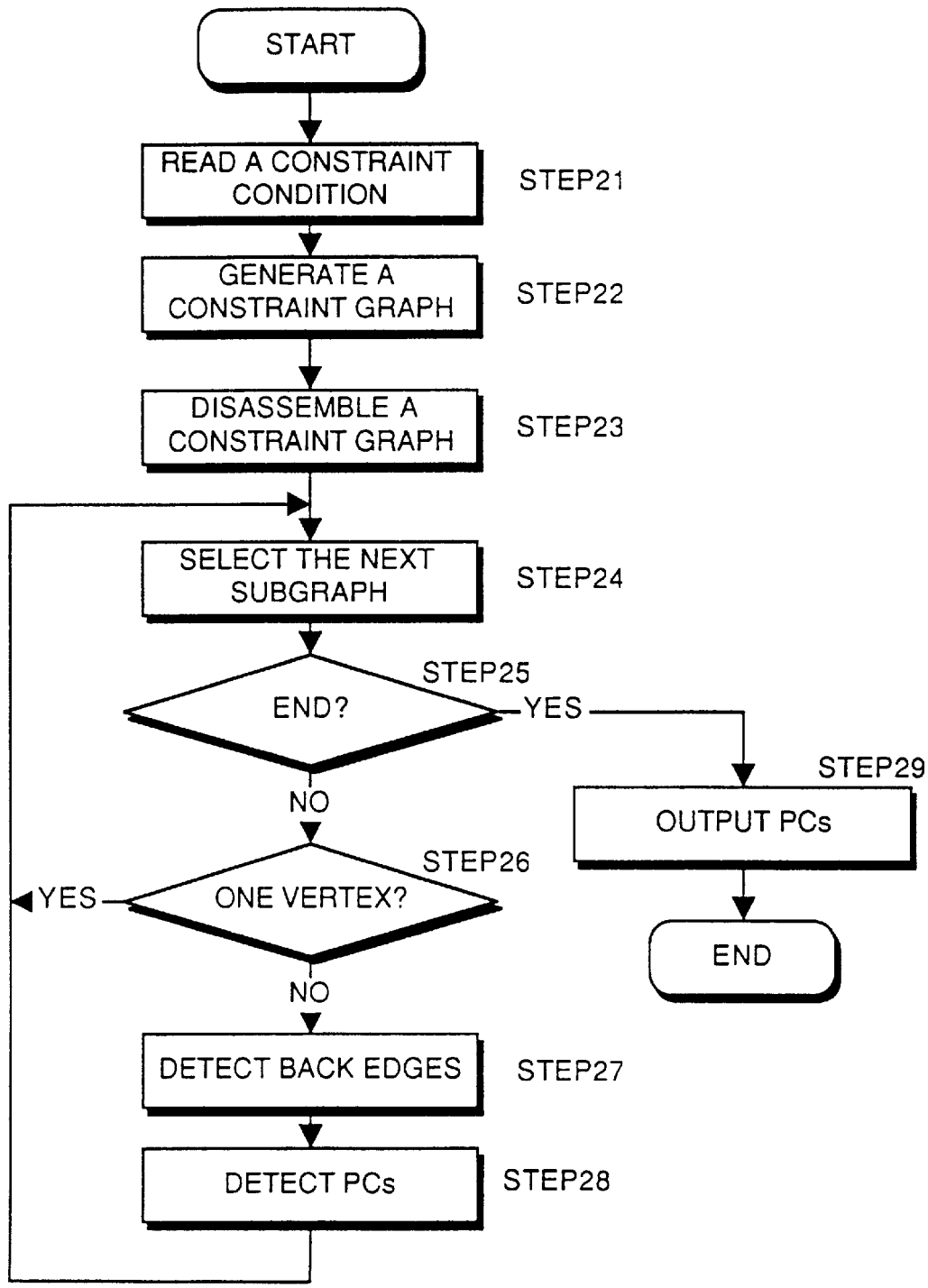
FIG. 2 is a flowchart showing the operation procedure of the constraint condition evaluation system used in the first embodiment of this invention.

The first embodiment which has the composition described above performs the operation as follows. FIG. 2 is a flowchart showing the processing procedure of the first embodiment.

[Obtaining a constraint graph]

First, this system receives a constraint evaluation condition from the inputting means 1 (step 21). This is done, for example, by allowing the user to enter component specifications or constraint contents with the use of symbolic language statements or to select component types or constraint conditions interactively. The generating means 2 generates a constraint graph based on the entered constraint condition (step 22). It is generated according to some specific rule, for example, which generates vertexes and edges based on the positional relation of the components. The constraint graph may be stored in memory or in magnetic disc.

[Disassembly]

The disassembling means 3 disassembles the generated constraint graph into a plurality of subgraphs without dividing cycles (step 23). At this time, the disassembling means 3 disassembles the constraint graph into subgraphs in units of strongly-connected components. No cycle extends across a plurality of strongly-connected components and, in addition, disassembly into strongly-connected components is done efficiently, making it possible to disassemble the constraint graph efficiently and without dividing cycles. The constraint graph may be disassembled into subgraphs not in units of strongly-connected components but in other desired kinds of groups of components or by other algorithms as long as a cycle is not divided. If all the PCs have been detected in each disassembled subgraph, it can be said that all the PCs in the original constraint graph have been detected (claims 2, 15).

A strongly-connected component in a directed graph is a larger set of vertexes, in which paths exist from every vertex to all others (Reference 4: A. V. Aho, J. E. Hopcloft, J. D. Wolman/Yoshio Oono, "Data Structure and Algorithm": Baifukan Publishing Co.)

A strongly-connected component is identified efficiently through the depth-first search. That is, the depth-first search is performed on the directed graph, and vertexes are numbered in the sequence in which each recursive call process completed. Then, the second directed graph is created with all the edges of the directed graph in the reverse direction. In addition, the depth-first search is performed on the second directed graph with the vertex with the largest number by said depth-first search as the initial vertex. If there is one or more vertexes which are not reached during this search, the depth-first search is performed again with the vertex with the largest number as the initial vertex. The range which can be reached from one vertex during the search on the second directed graph is determined to be a strongly-connected component. There are as many strongly-connected components as there are vertexes which are selected as the initial vertex.

Figure 3:
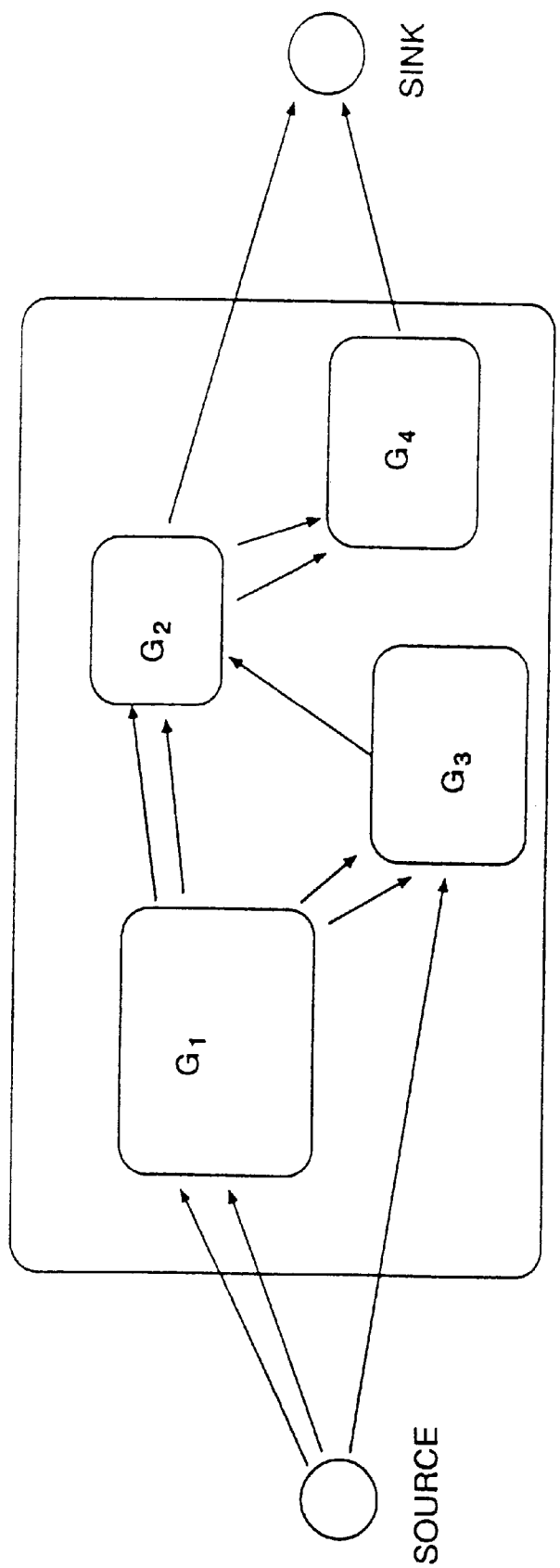
FIG. 3 is a conceptual diagram showing how a constraint graph is disassembled in the first embodiment of this invention.

In the following discussion, a subgraph is represented as Ga=(vertex group Va, edge group Ea), (a=1, . . . , k), where the vertex group Va={v1, v2, . . . , vma} is a set of ma vertexes in the subgraph Ga and the edge group Ea is a set of edges (branches) in the subgraph Ga. Because any given vertex in the constraint graph G belongs to one subgraph Ga, the total number of vertexes in the constraint graph G equals the number of vertexes in all the subgraphs (m1+m2+ . . . +mk). FIG. 3 is a conceptual diagram showing how a constraint graph is disassembled. In this figure, the constraint graph is disassembled into four subgraphs: G1 to G4.

[Subgraph removal]

The system sequentially selects subgraphs (steps 24, 25) and detects back edges from each subgraph. Before the detection, the removing means 6 removes a subgraph which has only one vertex (step 26). This is because the initial vertex and the terminal vertex of an edge in a constraint graph never be the same vertex and therefore one vertex never form a cycle. As a result, this system detects back edges and PCs only in those subgraphs which have a plurality of vertexes, thus increasing the efficiency of the process (claims 7, 20)

[Back edge detection]

The back edge detecting means 4 detects all the back edges from a subgraph containing a plurality of vertexes (step 27). Because cycles always contain back edges, this detecting of back edges makes the process speedy.

First, a back edge is defined as follows: The system sorts vertex data in the subgraph into ascending order of positions and, for those vertexes in the same positions, into ascending order of memory addresses where their vertex data is stored.

In this situation, the terminal vertex of an edge usually located on the larger position than the initial vertex. When the terminal vertex position is smaller than the initial vertex after they are sorted, the edge is determined to be a back edge.

Figure 4:
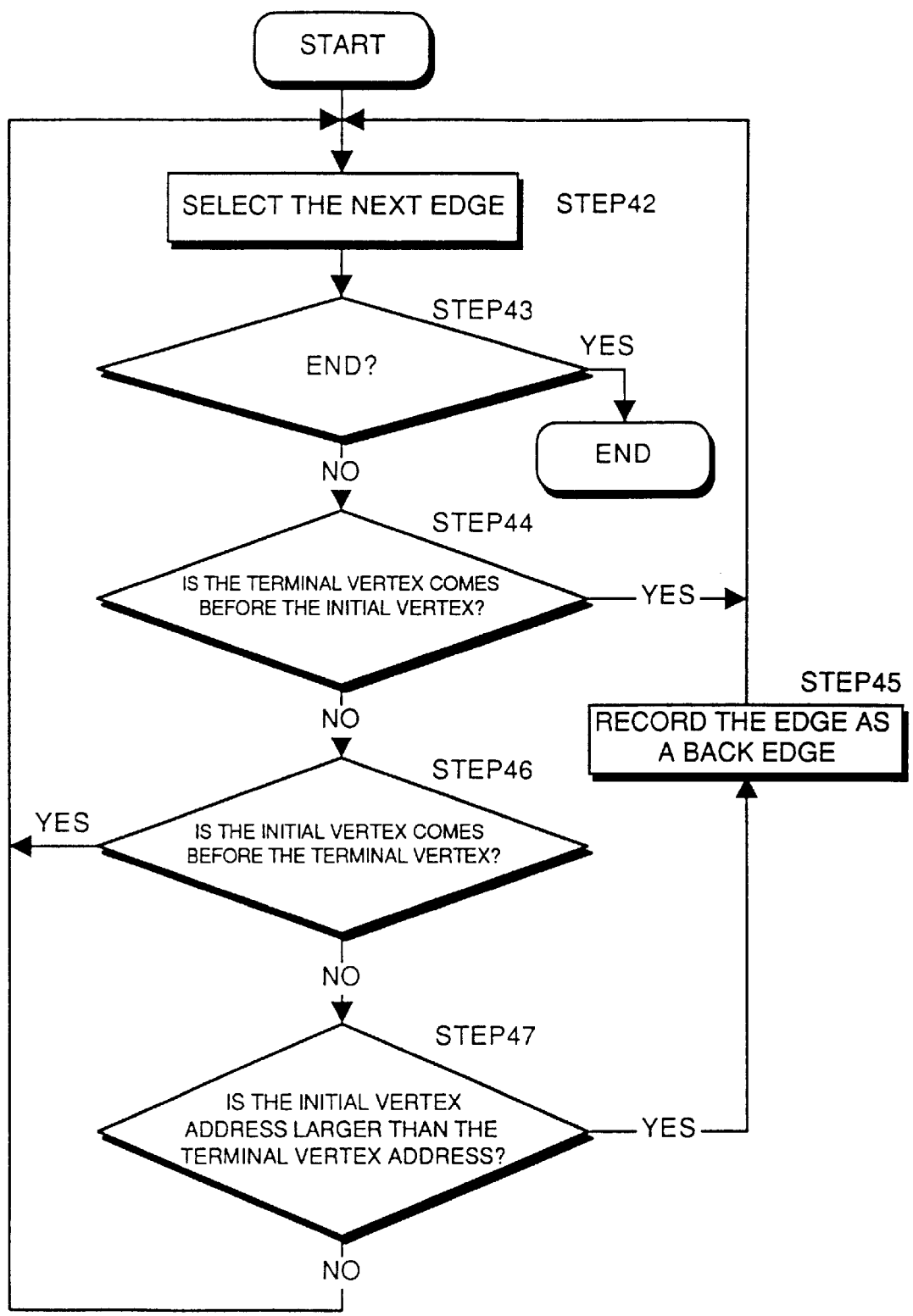
FIG. 4 is a flowchart showing an example of back edge detection processing of the first embodiment of this invention.

FIG. 4 is a flowchart showing the procedure for detecting back edges. Edges are selected (steps 42, 43), one at a time, and a check is made to see if a selected edge is a back edge according to the following criteria. If the positional value of the initial vertex of an edge is larger than the positional value of the terminal vertex (step 44), that is, if the terminal vertex comes before the initial vertex (the terminal vertex is nearer to the source), then the edge is a back edge (step 45). Otherwise, the edge is not a back edge (step 46).

For an edge whose initial vertex position and terminal vertex position are the same, the address of the memory area where the initial vertex information is stored (hereafter called "initial address") is compared with the address of the memory area where the terminal vertex information is stored (hereafter called "terminal address"). If the initial address is larger than the terminal address, the edge is a back edge (step 47); otherwise, the edge is not a back edge.

[PC detection]

Next, the PC detecting means 5 detects PCs from each subgraph (step 28). PCs are detected according to the prior art. Thus, in the first embodiment, a constraint graph is disassembled into a plurality of subgraphs, and PCs are detected in each subgraph. In general, the PC detection time increases at a rate larger than O(n), where n is the number of components in the constraint graph. However, the system used in the first embodiment detects PCs in a smaller range in order to prevent the processing time from increasing, thereby decreasing the PC detection time. In addition, because a cycle is not divided in disassembling the constraint graph, this system always detects all the PCs. (claims 1, 14)

Let the number of vertexes in the constraint graph G be n. Then, the PC detection time in G according to the prior art is O ($n^2$ log n) (Reference 1). When the processing time increases at a rate higher than O(n), the processing time is reduced by dividing the processing. As compared with the prior art, the first embodiment requires an extra process for disassembling the constraint graph. This process may be executed within the time O(n), which is several orders smaller than the time needed for other processes. This means that, as the scale becomes larger and larger, the ratio of time needed for disassembly in the time needed for the entire process becomes so small that may be ignored.

In this case, the PC detection time in the subgraph is O ($ma^2$ log ma) and so the PC detection time order for the constraint graph G is as follows:

$$\sum_a m_a^2 \log m_a = nm_k \log m_k + \sum_{a \neq k} m_a \log \frac{m_a^{m_a}}{m_k^{m_k}} \quad \text{[Formula 19]}$$

By selecting the maximum of mj (j=1, . . . , b) for mk, the second term on the right hand side is 0 or smaller, the PC detection time according to the prior art does not exceed O (n mk log mk).

Figure 5:
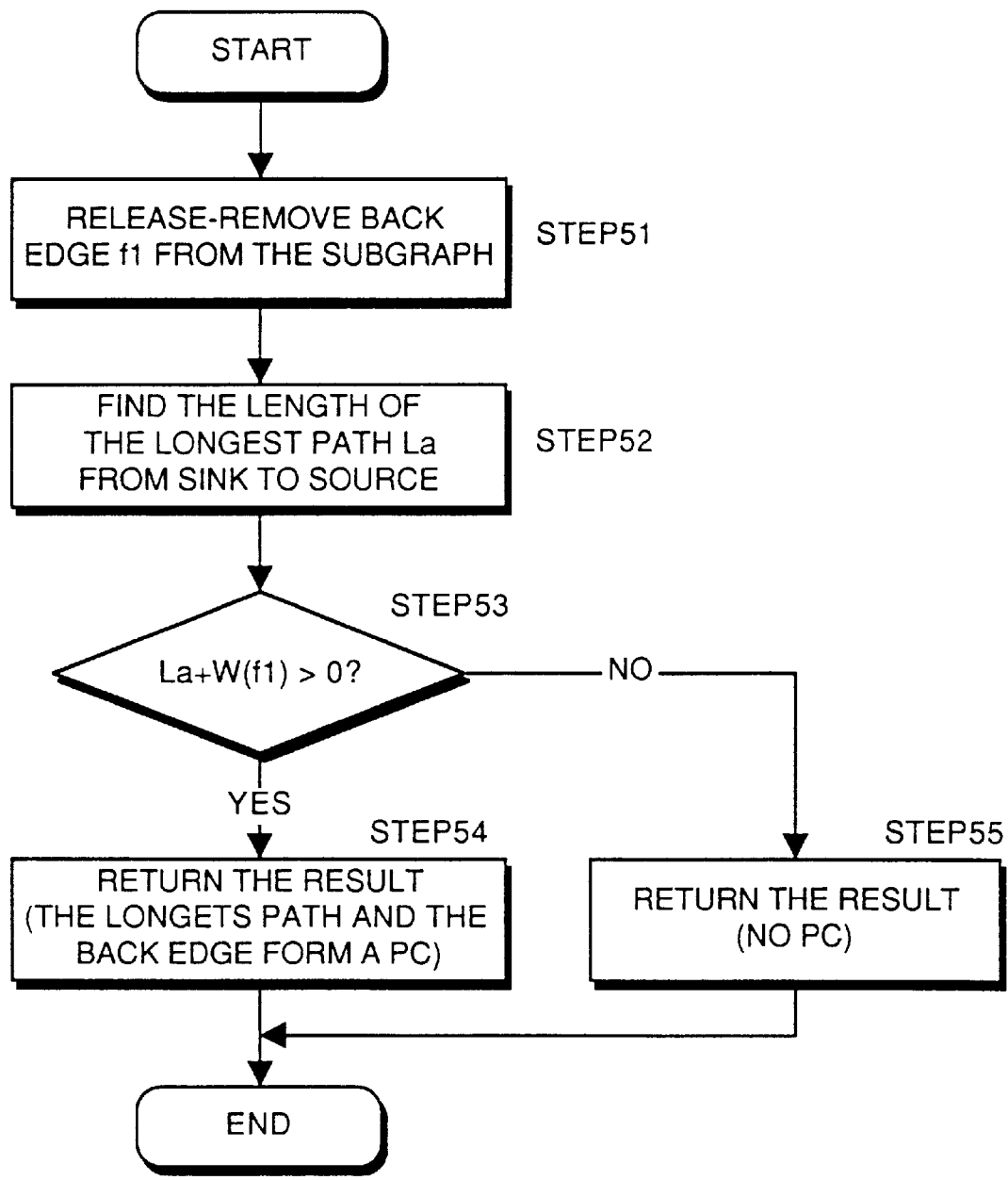
FIG. 5 is a flowchart showing the PC detection procedure when there is one back edge in the first embodiment of this invention.

When the subgraph Ga contains one back edge, the procedure described below speedily detects PCs (FIG. 5). First, the procedure performs the removal processing for the only back edge f1 that is contained in the subgraph Ga (step 51). Here, "removal" refers to the removal of an edge from the graph G=(V, E), which contains the vertex set V and the edge set E, with both ends remaining in the graph.

(Reference 5: Masao Iri, Isao Shirakawa, and Youji Kajitani et. al., "Graph Theory Exercise", pp. 4, Corona Publishing Co.). And, the graph G'a, whose source is the initial vertex of the back edge and whose sink is the terminal vertex, if created, does not contain a cycle. A graph which does not contain a cycle is called an acyclic graph.

Then, the procedure calculates the length of the longest path (La) from the sink to the source of the graph G'a (step 52). It is known that the longest path between any two vertexes in an acyclic graph containing ma vertexes is calculated within the length of time O (ma). Therefore, the length of the longest path (La) from the sink to the source in this graph G'a is also calculated within the time O (ma). If the longest path length La exceed the weight W(f1) of the removed back edge (step 53), that is, if

[Formula 20]

$$La+W(f1)>0$$

then the subgraph Ga contains a PC. In this case, the longest path and the removed edge f1 are determined to construct the PC, and the information on them is stored in the specified memory area (step 54).

On the other hand, if the longest path length La does not exceed the weight W(f1) of the back edge, that is, if

[Formula 21]

$$La+W(f1)\leq 0$$

then there is no PC in the subgraph Ga and so data indicating this condition is returned as the result. (step 55).

The processing time of the above procedure is spent mostly in calculating the longest path, which is O (ma). So, the PC detection time when there is only one back edge is also O (ma) for ma vertexes. On the other hand, when there are a plurality of back edges in the subgraph, the PC detection time is O ($ma^2$ log ma). Therefore, when all the subgraphs contain a plurality of back edges, the processing time is the maximum. However, even in this case, the time, which does not exceed the O (n mk log mk), is less than the processing time O ($n^2$ log n) (claims 8, 21).

As more and more subgraphs contain only one back edge, the processing time is reduced. When all the subgraph each contain only one back edge, the processing time of each subgraph is O (ma) and, therefore, the PC detection time in the constraint graph G is O (n). If mk does not depend on n, the processing time is O (n) regardless of how many back edges are in the subgraph.

As described above, the first embodiment not only disassembles a constraint graph but also selects the PC detection procedure according to whether the subgraph contains only one back edge or whether it contains two or more back edges. Thus, the PC detection time is significantly reduced.

Information on identified PCs is stored in the specified memory area. It may also be displayed or printed (step 29), or is recorded in a file for later use.

(3) Second embodiment

After the constraint graph G is disassembled into subgraphs Ga (a=1, . . . , k), each containing a plurality of vertexes, we can also find PCs by repeating the following process (corresponding to claims 3, 4, 6, 9, 10, 11, 12, 16, 17, 19, 22, 23, 24 and 25). Before doing this process, a unique label 'a' is assigned to the vertexes and edges in the subgraph Ga. As a result, collecting vertexes and edges associated with 'a' forms the subgraph Ga. Because the vertexes and edges forming the subgraph Ga are also the vertexes and edges forming the constraint graph G, removing back edges from the subgraph Ga also removes back edges from the constraint graph G.

Figure 6:
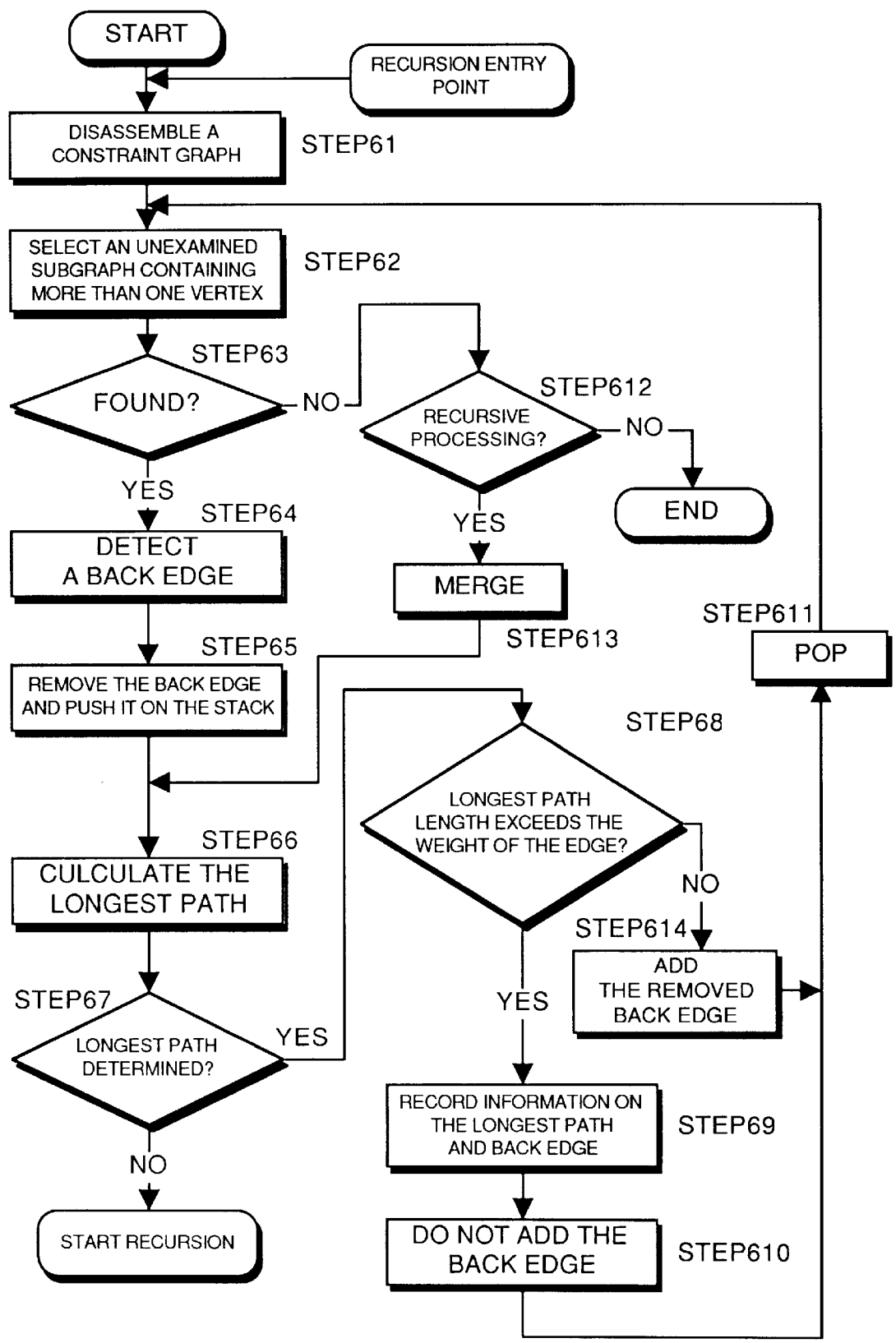
FIG. 6 is a flowchart showing the processing procedure of the second embodiment of this invention.
Figure 7:
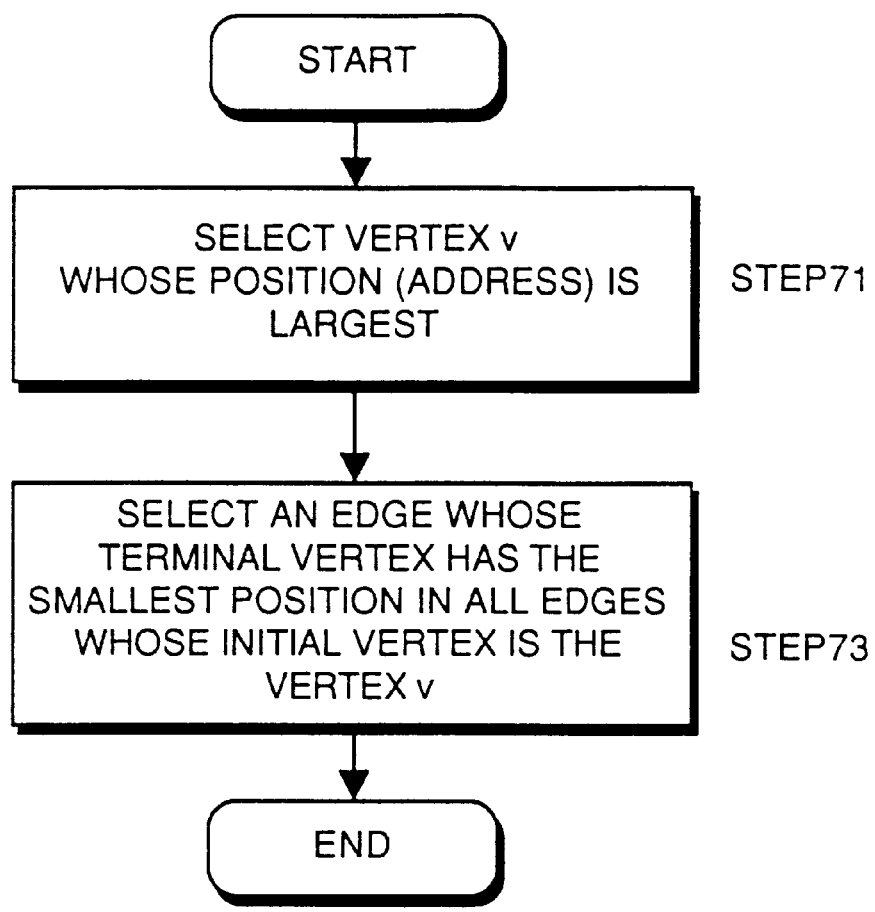
FIG. 7 is a flowchart showing the procedure which detects only one back edge in the second embodiment of this invention.

FIG. 6 is a flowchart showing the procedure of the second embodiment. In this procedure, the system disassembles the constraint graph (step 61), selects un-examined subgraphs Ga, one at a time, containing a plurality of vertexes (steps 62, 63), and detects one back edge fa from the selected subgraph (step 64). Although the definition of a back edge is the same as that in the first embodiment, the system selects only one back edge in this embodiment. FIG. 7 is a flowchart showing the procedure for detecting only one back edge. In this procedure, the system finds in the subgraph the vertex with the maximum positional value and, from the set of edges starting from the found vertex, selects the terminal vertex whose positional value is the smallest.

That is, from the vertexes Vi in the subgraphs Ga, the system finds the vertex whose position X (vi) is highest (step 71). When there are a plurality of vertexes whose positions are highest, the system selects the vertex whose information is stored in the highest memory address P(vi). Then, from the edges whose initial vertex is the selected vertex, the system selects the edge whose terminal vertex is lowest (step72). When there are a plurality of terminal vertexes vj whose positions are lowest, the system selects the vertex whose information is stored in the lowest memory address P(vi).

The back edge selected according to the above procedure has a large initial positional value and a low terminal positional value. Therefore, there is a high possibility that the longest back edge is found speedily (claim 9, 22).

Next, the detected back edge fa is removed from the subgraph Ga (step 65) to create a back-edge-removed graph:

[Formula 22]

$$G'a=Ga-fa$$

The removed back edge. fa is pushed onto the recursion stack (step 65). In the second embodiment, the top entry of the stack is the current back edge associated with PC detection.

Let the terminal vertex of the back edge fa be the source of the subgraph G'a, and the initial vertex of the back edge fa be the sink of the subgraph G'a. Calculation of the longest path is performed on this back-edge-removed graph to see if it has a PC (step 66).

Figure 8:
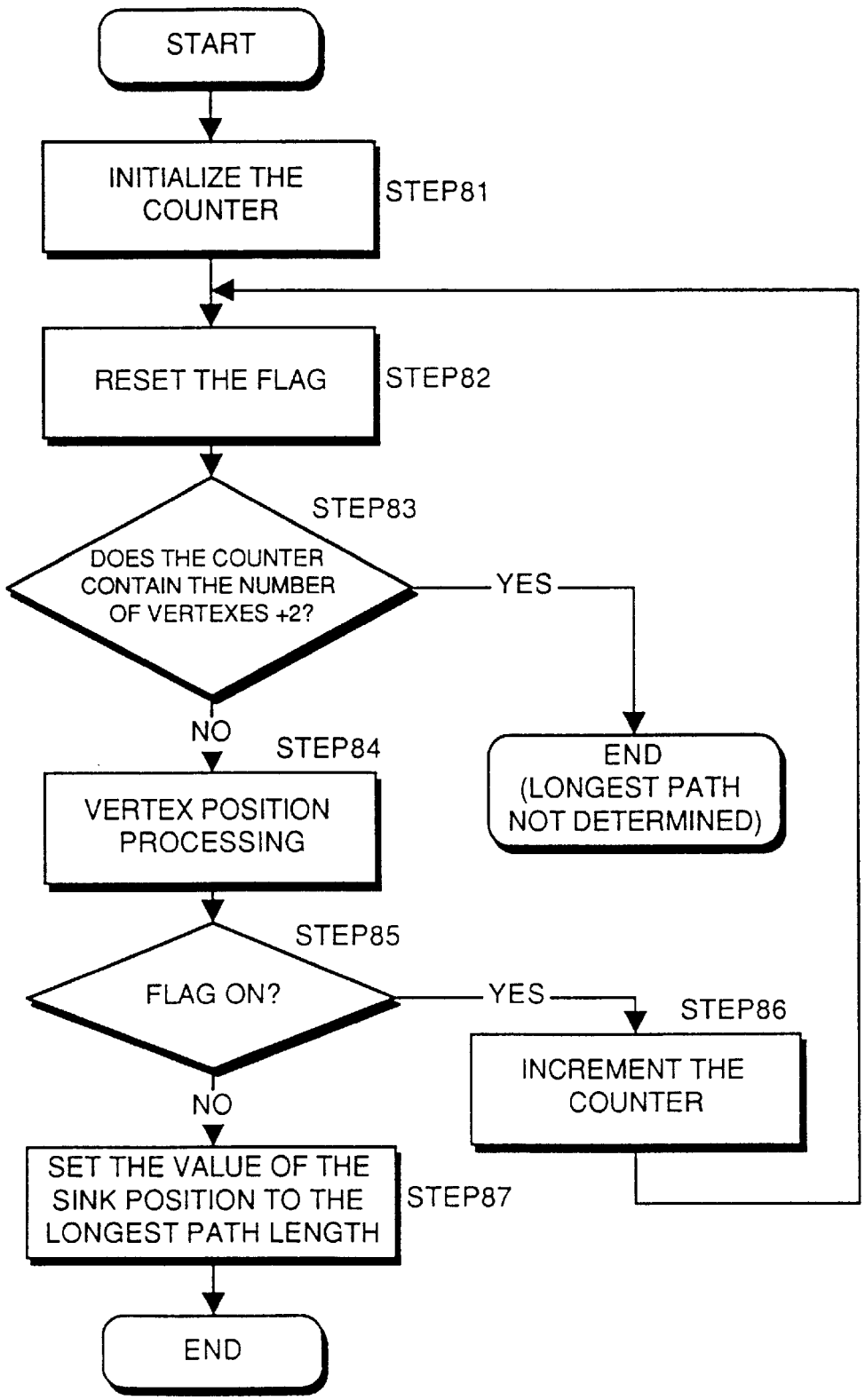
FIG. 8 is a flowchart showing the procedure for calculating the longest path in the second embodiment of this invention.

FIG. 8 is a flowchart showing the procedure for calculating the longest path. As the initialization process (step 81), the procedure first counts the number of vertexes in the subgraph G'a and assigns it to ma, and sets the position X (vi) as X (vi)="the minimum value X(vi) can take or smaller enough value than the position of the source" for all the vertexes vi except the sourc (X (source)=0), and resets the loop counter to zero.

In the vertex position processing shown in step 84, when the distance between two vertexes does not satisfy the constraint condition, the vertex position is modified to the marginal position, i.e., to the boundary position, which satisfies the onstraint condition. On the other hand, if the position of a non-source vertex is set to a position that is smaller enough than the position of the source as described above, all the non-source vertexes do not satisfy the constraint condition. Therefore, the vertex position processing causes the position of the vertex to the marginal position, i.e., to the boundary position, which satisfy the constraint condition. At this time, the longest path can be detected by examining the critical path.

The n, the following procedure is repeated for all the vertexes vi in the same sort sequence in which back edges were defined. When the value obtained by adding the weight W ($e_{ki}$) of the edge, from some other vertex vk to the vertex vi, to the position of the vertex vk (k≠i) and the resulting value exceed the position X(vi), the position X(vi) of the vertex is replaced by the value obtained through the addition (step 84). This is represented as follows:

$$X(v_i) = \max\left(X(v_i), \max_{k \neq i}(X(v_k) + W(e_{ki}))\right) \quad \text{[Formula 23]}$$

This means that position of all vertexes are repositioned so that the maximum weight of each edge between vertexes does not exceed the difference between the vertexes. If one of the positions X(vi) is changed, the flag is turned on. As a result, after all the vertexes vi have been processed, the flag is on if at least one of the vertex positions X (vi) is changed. When the flag is on (step 85), the procedure increments the counter (increases it by 1), turns off the flag (step 82), and then repeats the above procedure.

If the counter reaches ma+2 in step 83, the process is terminated assuming that the longest path length was not obtained correctly. That is, even if a cycle contained in the subgraph G'a affects the position of an already adjusted vertex position, this is resolved in ma iterations.

When the subgraph G'a does not contain a PC, the absolute value of the weight of a back edge is larger than the absolute value of the total of the weights of the edges forming the longest path from the terminal vertex of the back edge to the initial vertex of the back edge. So, the position of the initial vertex of the back edge becomes larger as the positions of vertexes on the longest path is determined. Even when the initial vertex of the back edge has reached the end of the longest path, the absolute value of the back edge weight is kept still larger than the difference between the initial vertex and the terminal vertex of the back edge. Even if the positional adjustment of the terminal vertex of the back edge has been performed in this state, the position of the terminal vertex is not be changed with respect to the initial vertex. Because the initial vertex position plus the back edge weight is smaller than the terminal vertex position at that time and therefore does not cause the terminal vertex position to be replaced.

Therefore, even when position adjustment is done the maximum number of times (ma times) to terminate the iteration of vertex position replacements, the positional adjustment of the vertex is no longer needed for the (ma+1)th process and the flag remains off. At this time, the longest path from source 'v source' to sink 'v sink' has the longest path length La=X(v sink) (step 87). In this case, each vertex is located at a position where the sum of the weight of the edge for the vertex and the positional value of the initial vertex of the edge is largest. The critical path is a path composed of only the edges whose weight $e \mu v$ matches the initial vertex to terminal vertex distance X(v $\mu$)-X(v v) and, in this case, the critical path is the longest path.

Conversely, when the cycle associated with the back edge is a PC, adding the weight of the back edge to the initial vertex position makes larger than the terminal vertex position because the absolute value of the weight is smaller than the longest path length. This, in turn, changes the terminal vertex position, causing all the vertexes of the edges starting at that terminal vertex to change again. This change eventually increases the position of the initial vertex of the edge which had started this change. As a result, because the back edge keeps moving while increasing the initial vertex position and the terminal vertex position, the positional adjustment of the vertex is made even in the (ma+1)th processing and control returns to step 82. So, we know that the subgraph G'a contains a PC if the counter reaches ma+2 (step 83).

If the longest path length La is found as a result of longest path calculation (step 67) and if the longest path length La does not exceed the weight W (fa) of the back edge (step 68), that is, if

[Formula 24]

$$La+W(fa) \leq 0$$

then no PC is present in the subgraph Ga. In this case, the back edge removed in step 65 is added (step 614) and the procedure is executed for the next subgraph beginning with step 62.

If the longest path length La is found as a result of longest path calculation (step 67) but if the longest path length La exceed the weight W (fa) of the back edge (step 68), that is, if

[Formula 25]

$$La+W(fa)>0$$

then no PC is present in the back-edge-removed subgraph G'a. In this case, the longest path and the removed back edge form a PC, and this is recorded (step 69). The procedure is executed with the back edge still removed from the subgraph (step 610). The current back edge (data) pushed onto the stack as the top entry is popped up before the next subgraph processing except when recursion is performed (step 611).

On the other hand, if the longest path is not found correctly, a PC is present in the back-edge-removed graph G'a and the same processing is repeated for this back-edge-removed graph G'a recursively. When the processing for all the disassembled subgraphs has been ended during recursion (step 612), the subgraphs are merged into the state before recursion (step 613).

Figure 9:
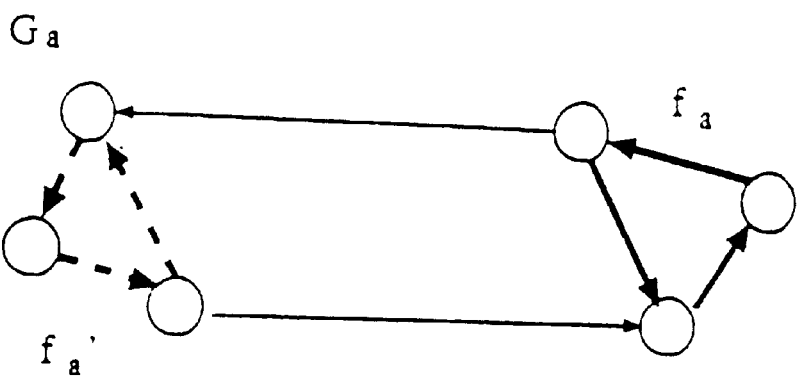
FIG. 9 is an example of constraint graph from which a PC is detected in the second embodiment of this invention.
Figure 10:
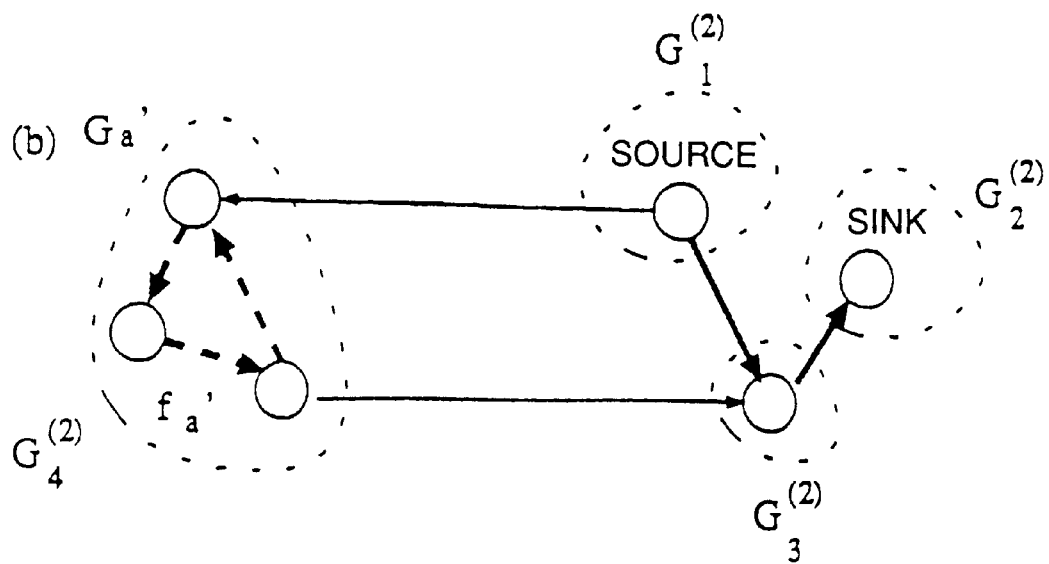
FIG. 10 is an example of constraint graph from which a PC is detected in the second embodiment of this invention.

For example, FIG. 9 shows an example of constraint graph to be evaluated using the system in the second embodiment. In this example, there are two independent PCs, PC1 (indicated by solid arrows) and PC2 (indicated by dotted arrows). The system detects the back edge fa and, by performing removal for this back edge fa, generates the subgraph G'a shown in FIG. 10. The removed back edge fa is pushed onto the stack, and the top entry of the stack becomes the current back edge (state 1).

Figure 11:
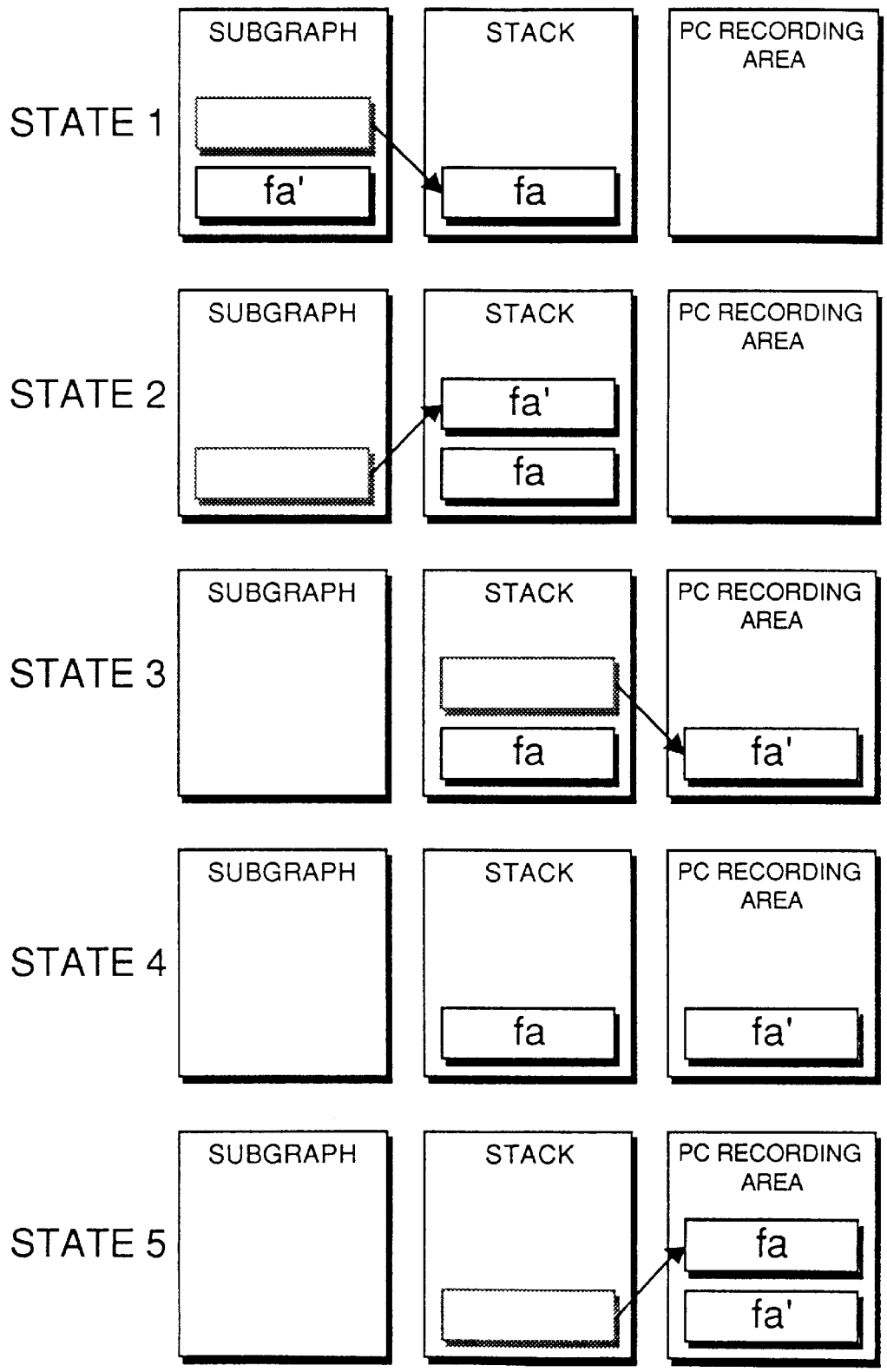
FIG. 11 is a conceptual diagram showing the state of back edges fa and fa' in the example in FIG. 9.

FIG. 11 shows the conceptual diagram of the state of back edges fa and fa' in the example shown in FIG. 9. In state 1, the longest path cannot be found correctly, it is determined that a PC is present in the subgraph G'a, and the procedure is executed again for the subgraph G'a beginning with step 61.

As a result, the subgraph G'a is further disassembled into four subgraphs, G(2)1 to G(2)4, and the longest path is calculated for G(2)4 which contain more than one vertex. When fa' is the top entry of the stack, that is, when it is the current back edge (state 2), PC2 containing fa' is detected. So, the current back edge fa' is moved to the PC recording area (state 3).

Figure 12:
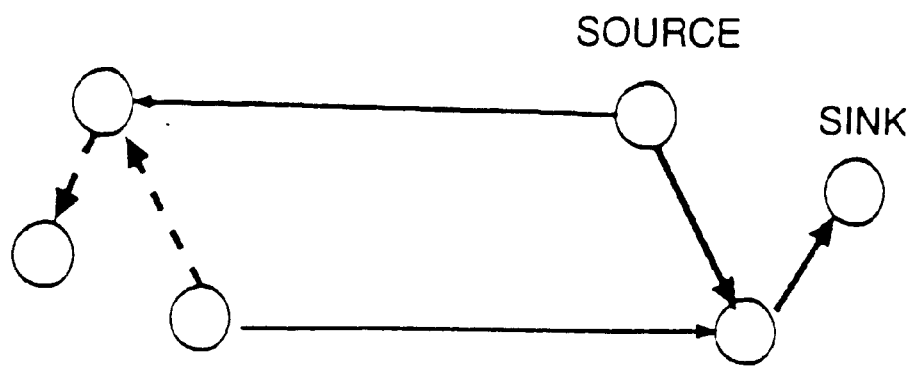
FIG. 12 is a diagram showing an example of constraint graph from which a PC is detected in the second embodiment of this invention.
Figure 13:
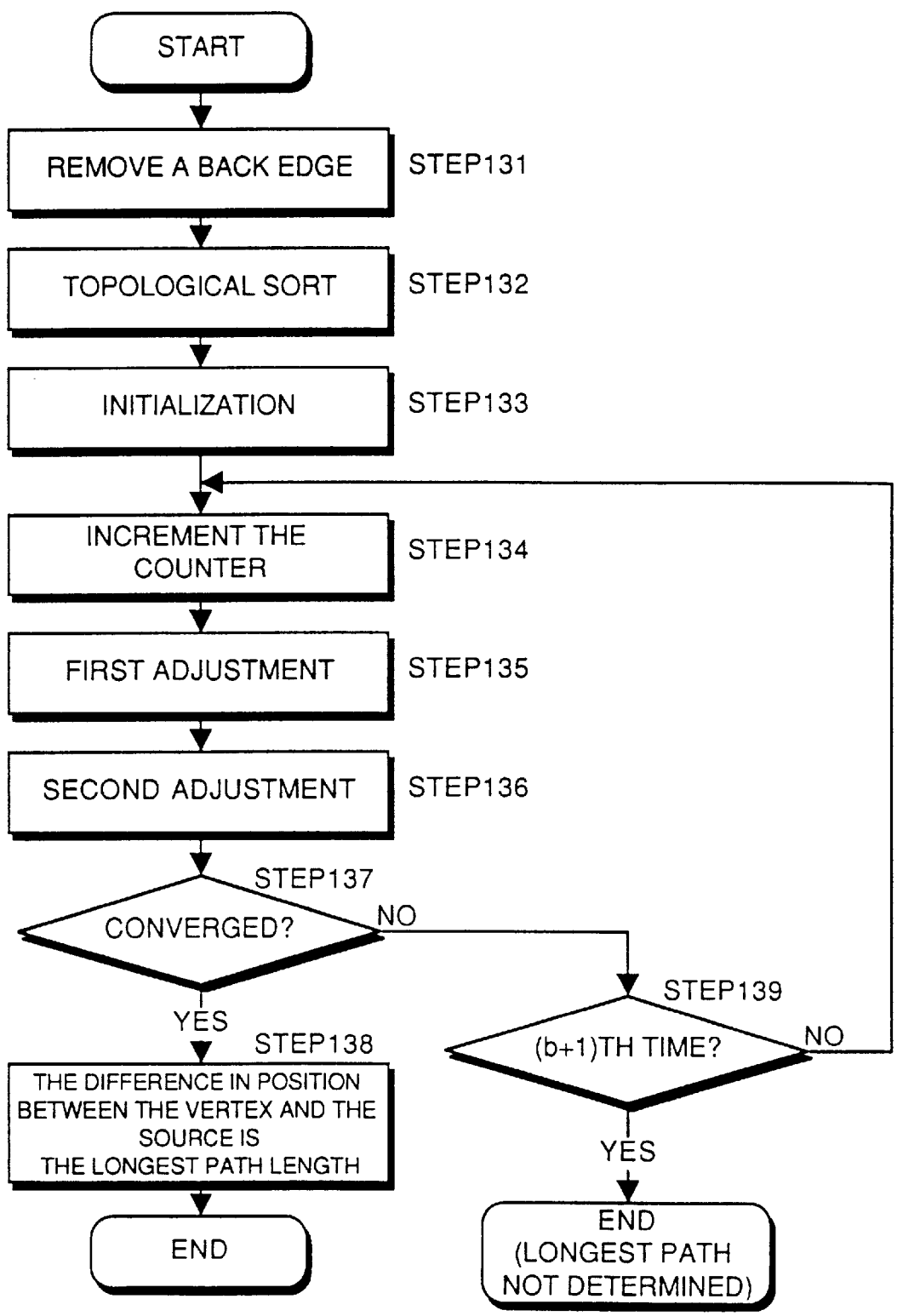
FIG. 13 is a flowchart showing the procedure of the third embodiment of this invention.
Figure 14:
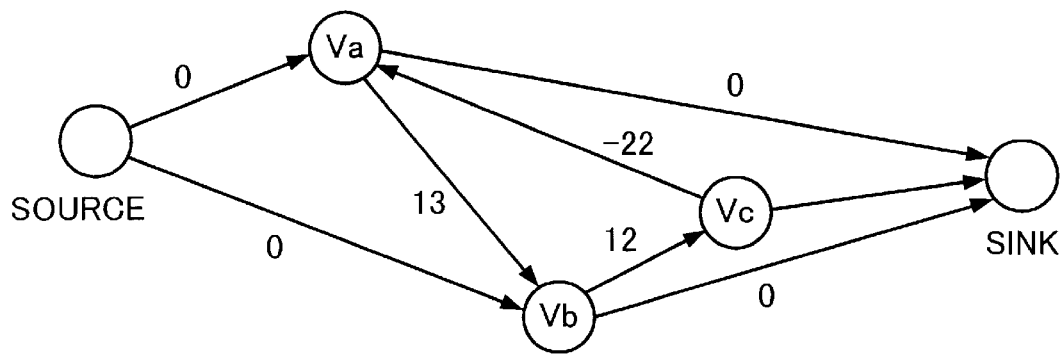
FIG. 14 is a diagram showing an example of constraint graph.
Figure 15:
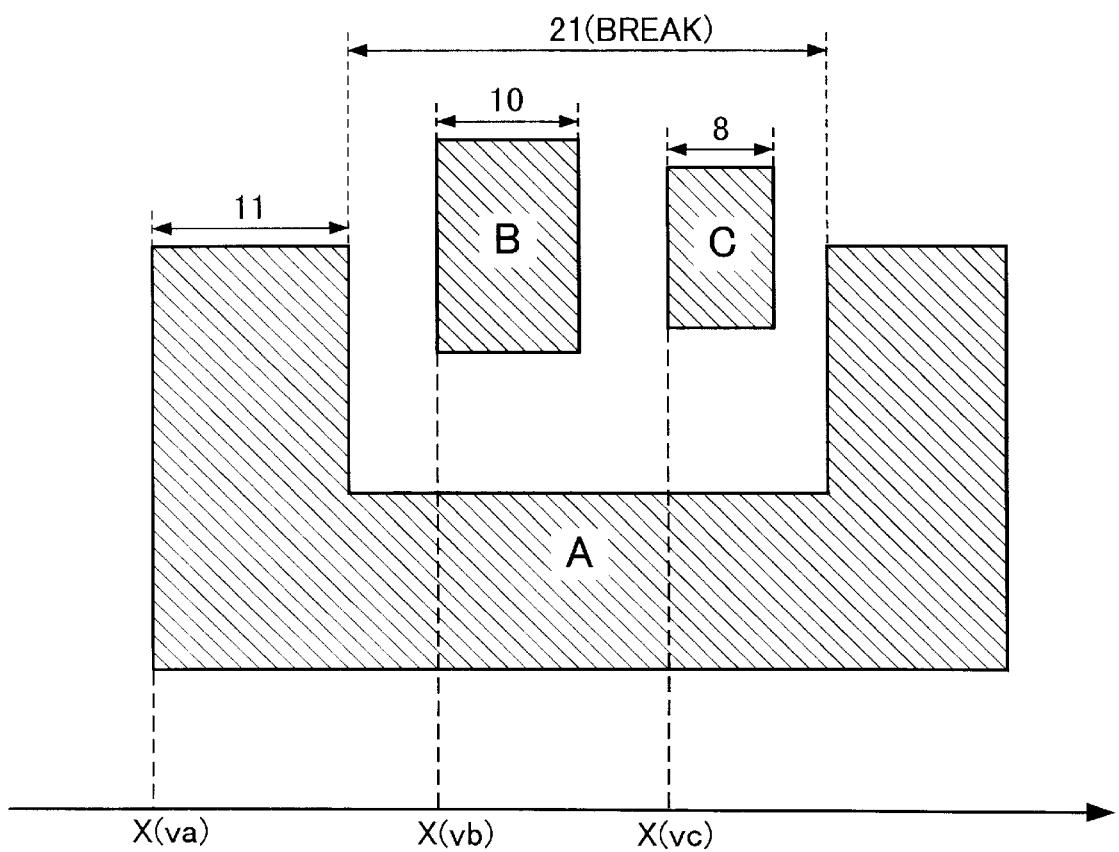
FIG. 15 is a diagram showing an example of the layout of the components corresponding to the constraint graph in FIG. 14.
Figure 16:
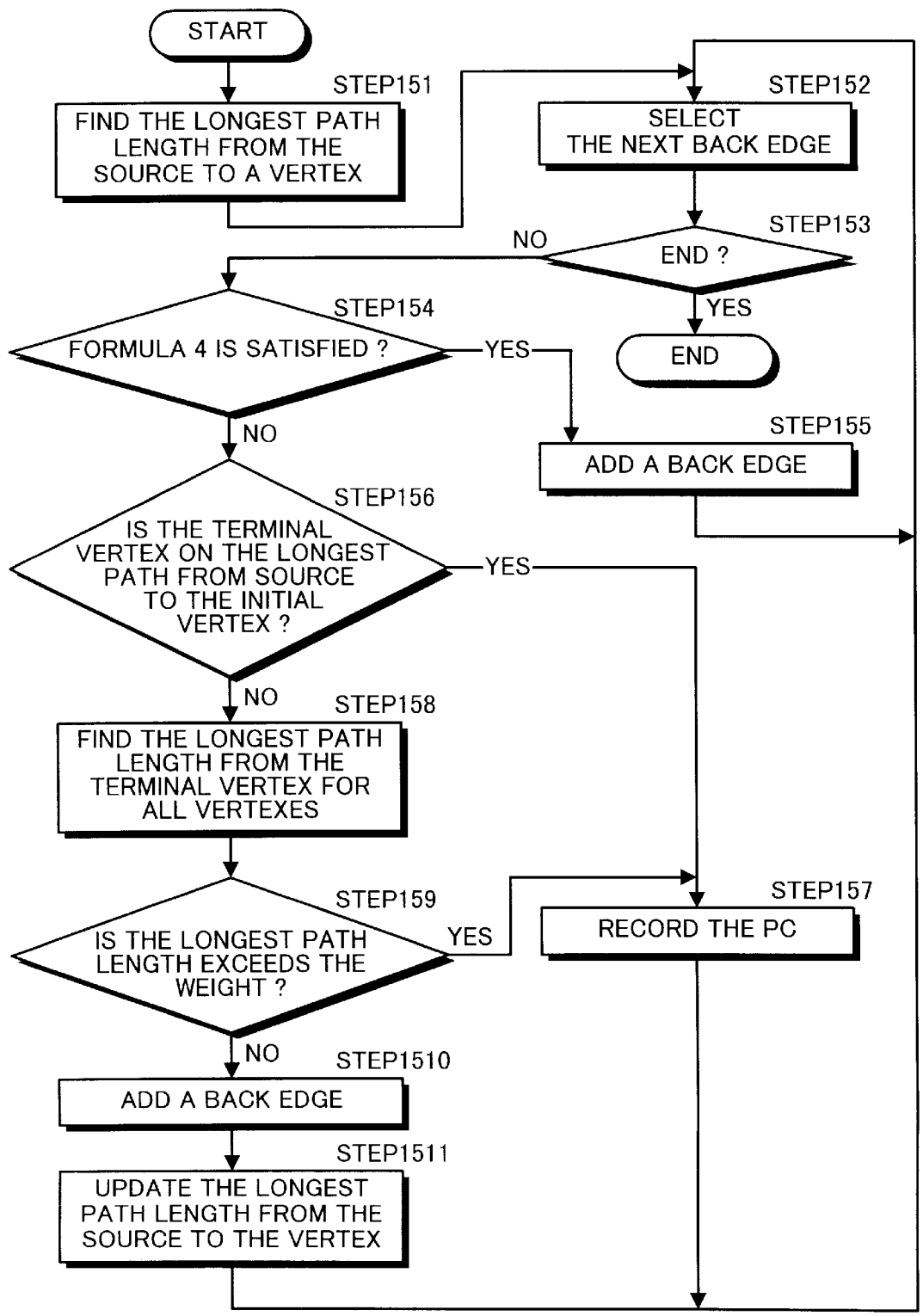
FIG. 16 is a flowchart showing an example of PC detection procedure according to the prior art.

When recursive execution is terminated, the back edge fa, which was pushed on the stack before, becomes the top entry of the stack (state 4) and the subgraph returns to the original subgraph Ga from which the back edge fa' has been removed. In this state, the back edge fa' does not prevent the longest path from being calculated. Therefore, though the calculation of longest path from initial vertex of fa to terminal vertex of fa, it is determined that the current back edge fa forms a PC, and information on the back edge fa is moved to the PC recording area (state 5). Thus, the second embodiment allows us to detect all the PCs in a subgraph and, after the detection of them, the resulting constraint graph does not contain PCs (FIG. 12).

As described above, by the system of the second embodiment, only one back edge is detected from a subgraph and, detect a PC by calculating the longest path and longest path length. When the subgraph contains a PC, recursive process including the disassembly is performed for further detection of the PC. Therefore, though using a simple unit process which processes one back edge at a time as the recursion unit process, the repetition of subgraph disassembly reduces the entire PC detection time(claims 3, 4, 6, 16, 17 and 19).

When the subgraph contains a PC in the second embodiment, the system continues to detect PC by repeating a sequence of operations such as disassembly. This repetitive operation speeds up PC detection even in a large graph (claims 3, 16).

In addition, because a sequence of operations such as disassembly is executed recursively in the second embodiment, PCs may be detected efficiently in a sequence suitable for the structure of the graph while using a typical processing unit.

The second embodiment significantly reduces the PC detection time and allows us to calculate the detection time as follows. For simplicity, suppose that, after the k-th recursive processing, the numbers of vertexes in the subgraphs obtained as a result of each recursive processing are same and are $m^{(k)}$. Then, the number of subgraphs after the k-th recursive processing is $n/m^{(k)}$. Also suppose that the maximum number of recursive processings for detecting PCs is I and that the processing time for the unit PC detection procedure which does not contain recursive procedure for a subgraph composed of $m^{(k)}$ vertexes is $T(m^{(k)})$. Then, the processing time needed for processing all the vertexes is as follows:

$$O\left(n\left(\frac{T(m^{(1)})}{m^{(1)}} + \frac{T(m^{(2)})}{m^{(2)}} + \ldots + \frac{T(m^{(I)})}{m^{(I)}}\right)\right) \quad \text{[Formula 26]}$$

When $m^{(k)}$ does not depend on n, the time required to detect PCs from the constraint graph G is O (n).

In addition, because the time needed for calculating the longest path in a graph composed of m vertexes is $O(m^2)$ and because the time for calculating the longest path accounts for the most of the processing time, it can be said that the PC detection time is O ($m^2$). Thus, by assigning T (m)=O ($m^2$) to Formula 26, the PC detection time is O (n ($m^{(1)}+m^{(2)}+\ldots+m^{(I)}$)).

More generally, suppose that the subgraph which is obtained by executing PC detection processing including recursive processing, j times and which contains a plurality of vertexes is represented as $Ga^{(j)}$ ($a=1, \ldots, k^{(j)}$) and that the number of vertexes in each $Ga^{(j)}$ is $ma^{(j)}$ ($\geq 2$). In addition, suppose that the maximum of j is I. Then, $$\sum_{a=1}^{k^{(j)}} m_a^{(j)} \leq n \quad \text{[Formula 27]}$$

Because the PC detection time for each subgraph is O $((ma^{(j)})^2)$, the time required for all the processing is as follows:

$$\sum_{j=1}^{I} \sum_{a=1}^{k^{(j)}} (m_a^{(j)})^2 \quad \text{[Formula 28]}$$

In particular, if the maximum of $ma^{(j)}$ ($a=1, \ldots, k^{(j)}$) is $m^{(j)}$, the time required for all the processing is equal to or less than n ($m^{(1)}+m^{(2)}+\ldots+m^{(I)}$). This formula indicates that the time is reduced as $m^{(1)}+m^{(2)}+\ldots+m^{(I)}$ is reduced and that, if it does not depend on n, the processing time is O (n).

In the second embodiment, the longest path length is calculated by combining simple operations. These operations include moving the positions of vertexes according to the condition, checking the flag to monitor if a vertex has been moved, and checking the counter to monitor the number of repetitions. This simplifies the composition and speeds up processing. That is, the repetitive movement of vertexes means to reserve position differences which is equal or larger than the maximum weight of the edge among the vertexes. In this case, the repetitions of the vertex position movement is terminated by the same number of repetitions as the number of vertexes in the subgraph. Once the repetition of the vertex position movement is terminated, the vertexes are not moved thereafter. This means that the longest path length is successfully calculated. On the other hand, if a PC is contained, the initial vertex and the terminal vertex are repetitively moved because of the PC, and the repetition of vertex position movement is not terminated. For this reason, if the vertexes move more times than the number of vertexes, it is determined that the calculation of the longest path length has failed and that the subgraph contains a PC (claims 10, 17, 23 and 24).

In addition, in the PC detection process of the second embodiment, a small value that does not exceed the base position is used for calculating the longest path and the PC detection uses some variable. Since the minimum value of the variable range is used as said small value, when the small value is assigned to the variables, there is no need to determine the positions of the vertexes based on the base points and therefore the efficiency is further increased. In addition, when the minimum value is assigned, it is clear that the positions of vertexes other than the source are enough smaller than the position of the source and, as a result, all the constraint conditions are not satisfied for the positions of all the vertexes. Therefore, the repetitive movement of the vertexes results in generating the marginal positions that satisfy the condition (i.e., boundary points).

(4) Third embodiment

Detection of a PC through longest path calculation may also be performed by the following procedure. First, a back edge is removed from a constraint graph (In this specifications, this graph is called a forward graph). (step 131). The third embodiment makes use of the fact that a forward graph, from which a back edge has been removed, has a semiorder or partial order relation (Reference 6: Y. Liao, C. Wong, "An Algorithm to Compact a VLSI Symbolic Layout with Mixed Constraints".). Regarding edges between vertexes are order relation, descendants of one vertex have no sequence relation each other as long as any path from them does not meet on the single vertex. The vertexes, which have a order relation in the graph but do not always have a sequence relation depending upon the combination of the vertexes, are called to have a semi-sequence relation.

The system performs topological sort for this forward graph (step 132). Topological sort sorts the vertexes, associated with the semi-order relation, according to the order relation (Reference 7: "Algorithm and Data Structure", Kiyoshi Ishihata, pp. 242–244, Iwanami Software Science Series). Since the vertexes with no order relation are arranged in a variety of ways, there are many ways in which the vertexes are arranged by topological sort. For example, the depth-first search of the graph arranges the vertexes in a specific order. That is, when all the vertexes on the sink side are reached and control goes back to the source side, recording the number of the last-reached vertex sorts the vertexes in the reverse order of the topological sort result.

For the sorted forward graph, taking whose source vertex position as the base vertex, all non-source vertex positions are initialized to the values that are not larger than the base vertex position (step 133).

Then, the position difference between any two vertexes are adjusted equal to or larger than the weight of the edge between the vertexes (step 135). This first adjustment processing can be considered to be the procedure for finding the longest path (critical path) to each vertex in an acyclic graph with a single source. In the repeated procedure beginning with the first adjustment, the counter is incremented whenever the processing is started to count the repetitions (step 134).

The first adjustment means sequentially selects vertexes, one at a time, as the base vertex in the topological sort order, finds the edge from a non-base vertex to the base vertex, calculate a value; position of a non-base vertex plus the weight of the edge and, when the value is larger than the base vertex position, replaces the base vertex position with the value. This processing is the same as that for the vertexes in the second embodiment (step 84, formula 23).

Since the forward graph is an acyclic graph which does not contain cycles, all the vertexes are determined by simply doing this processing once in the sorted order. Then, each vertex satisfies the constraint represented by the edges other than the back edge.

Next, the weight of the back edge is added to its start position. If the end position of the back edge is less than the value obtained by this addition, the second adjustment is performed to replace the end position with the value obtained by this addition (step 136).

For a back edge which goes from right to left, this processing moves the left end of the back edge to the right. This adjusts the vertexes so that they satisfy the constraint represented by the back edge.

In the second adjustment, when the vertexes does not move, it means the vertex positions have been converged and so the procedure is terminated (step 137). When the vertex positions are still adjusted, this adjustment produce a possibility that the constraint of an edge other than the back edge is not satisfied. In this case, processing is performed again, beginning with step 134. Whether or not the vertex positions are moved (or converged) may be checked, for example, by flags as in the second embodiment.

As described above, the longest path from the source to each vertex may be obtained by executing the first adjustment processing and the second adjustment processing repeatedly. This repetitive processing converges the vertexes within b+1 repetitions, where b is the number of back edges, and the difference between the vertex position and the source position becomes the longest path (step 138). If the vertexes are not converged within b+1 repetitions (step 139), the constraint graph contains a PC. That is, the terminal vertex is changed to adjust itself to the back edge during the second adjustment processing, and the vertex positions are changed to adjust themselves to the change by the next first adjustment processing. Even if the vertexes are adjusted to one back edge during each repetition of the first and second adjustments, the adjustment of the vertexes to all the back edges should be completed when the (b+1)th processing is performed. Therefore, when the (b+2)th processing is required, it means that there is at least one conflict between the change in the position of the terminal vertex based on back edge weight and the change in the position of other vertexes caused by this terminal vertex movement (that is, there is a PC). Thus, in the third embodiment, because the number of repetitions required to detect a PC is usually less than the number of vertexes, PCs are detected efficiently (claims 13, 26).

(5) Other embodiments

This invention is not limited to the above embodiments, but it may be embodied in other specific forms without departing from the sprit or essential characteristics thereof For example, this invention may be applied to constraint conditions associated not only with the IC layout but also with any type of object such as scheduling. A constraint graph need not be output in the form of a chart; any type of data which represents the structure of a constraint graph may be used.

In addition, the data structure does not need to have one-by-one correspondence with each vertex or edge in the graph, any data structure can be used as long as it substantially represents the constraint graph. Also without using terms such "graph", "vertex" and "edge", the present invention can be realized by combinations of data to reproduce the graph, vertexes and edges.

Removal processing is not always required, nor is it necessary to change the PC detection procedure depending upon whether there is only one back edge or whether there are two or more. In addition, not only an integer but also a real number or an attribute or attribute value in some other form may be used as the weight. Recursive processing is not always required for PC detection.

Typically, this invention is implemented by a computer program; a medium on which the program is recorded is also another embodiment of this invention.

As described above, this invention, which provides a constraint condition evaluation method and a constraint condition evaluation system which detect PCs speedily in a constraint graph used in a large system., increases the efficiency of various types of layout work.

While a preferred embodiment has been described, variations thereto will occur to those skilled in the art within the scope of the present inventive concepts which are delineated by the following claims.

What is claimed is:

1. A constraint condition evaluation method for representing a plurality of constraints by a constraint graph and detecting overconstraints present in said plurality of constraints as positive cycles (PCs) in said constraint graph, wherein said constraint graph includes a plurality of vertexes, having an initial vertex and a terminal vertex, and a plurality of edges connecting the vertexes having a value and a direction, said method comprising the steps of:

A. disassembling said constraint graph into a plurality of subgraphs while retaining a cycle in the constraint graph;

B. detecting back edges in each subgraph; and

C. detecting the PCs associated with the back edges in each subgraph, wherein said PC detecting step includes the substeps of:

a. removing the detected back edge from the subgraph;

b. calculating, if possible, specific path information including the longest path and longest path length with a first point and a second point of the removed back edge, wherein, during calculation of said longest path and longest path length, with the source in a subgraph as a base vertex, said calculating step includes the substeps of:
  i. setting a vertex other than the source to a value equal to or smaller than that of said base vertex;
  ii. sequentially selecting the position of each vertex as the base vertex according to a sort sequence;
  iii. adding to the position of each non-base vertex the weight of an edge from the vertex to the base vertex to generate an addition value; and
  iv. replacing the position of the base vertex, when an addition value exceeds the base vertex position, with said addition value and moves the base vertex position; and
 c. determining whether a PC is present or not in said subgraph if the longest path length is calculated based on said calculating step.

2. The method of claim 1 wherein, when said longest path cannot be calculated, said back edge detecting step and PC detecting step are repeated for the subgraph.

3. The method of claim 1 wherein said PC detecting step includes the substeps of:
  calculating, if possible, the longest path and longest path length; and
  determining that a PC is not present in said subgraph if the longest path length does not exceed the weight of said removed back edge; and
  determining that a PC formed by the calculated longest path and said removed back edge is present if the longest path length exceeds the weight of said removed back edge.

4. The method of claim 1, wherein said PC detecting step calculates path information including the longest path and longest path length according to the number of back edges contained in the subgraph.

5. The method of claim 10 wherein said PC detecting step is repeated when:
  the vertexes do not move after the PC detecting step is performed more times than the number of vertexes in a subgraph, a difference between the sink position and the source position is used as the longest path length and, a path composed only of those edges, from those between the source and the sink, whose weight matches the distance between the initial vertex and the terminal vertex of the edge is used as the longest path; and
  it is determined that the longest path length is not found when the vertexes move after the PC detecting step is performed more times than the number of vertexes in a subgraph.

6. The method of claim 10 wherein a value of source position plus the minimum of the back edge weights is used as a value equal to or less than the position of said base vertex.

7. A constraint condition evaluation method for representing a plurality of constraints by a constraint graph and detecting overconstraints present in said plurality of constraints as positive cycles (PCs) in said constraint graph, wherein said constraint graph includes a plurality of vertexes, having an initial vertex and a terminal vertex, and a plurality of edges, connecting the vertexes having a value and a direction, said method comprising the steps of:
  A. disassembling said constraint graph into a plurality of subgraphs while retaining a cycle in the constraint graph;
  B. detecting back edges in each subgraph; and
  C. detecting PCs associated with the back edges in each subgraph, wherein said PC detecting step includes the substeps of:
    a. removing the detected back edge from the subgraph:
    b. calculating, if possible, specific path information including the longest path and longest path length with a first point and a second point of the removed back edge;
    c. determining whether PCs are present or not in said subgraph if the longest path length is calculated based on said calculating step;
    d. obtaining a forward graph from which a back edge has been removed from a constraint graph;
    e. topological-sorting the vertexes in the forward graph;
    f. setting, with the source as a base vertex, the non-source vertexes in a forward graph to a value equal to or less than said base vertex;
    g. adjusting the positions of each two vertexes with a connecting edge in a sorted forward graph so that at least a positional interval for the weight of the edge is reserved between them;
    h. adding the weight of each removed back edge to the initial vertex of the back edge and, if the terminal vertex of the back edge is less than this addition value, for replacing the terminal vertex with the addition value, wherein the adjusting step sequentially selects the position of each vertex as the base vertex according to the topological-sorting step, adds to the position of each non-base vertex the weight of an edge from the vertex to the base vertex to generate an addition value, and replaces the position of the base vertex, when an addition value is larger than the base vertex position, with said addition value and moves the base vertex position, and, repeats the adjusting step and the adding step, times equal to the number of back edges, then the adjusting step and adding step are terminated by returning a failure of the longest path calculation when the adjusting step and adding step have not converged, and, the longest path length and the longest path are returned when the adjusting step and adding step have converged.

8. The method of claim 7, wherein, when said longest path cannot be calculated, said back edge detecting step and PC detecting step are repeated for the subgraph.

9. The method of claim 7 wherein said PC detecting step includes the substeps of:
  calculating, if possible, the longest path and longest path length; and
  determining that a PC is not present in said subgraph if the longest path length does not exceed the weight of said removed back edge; and
  determining that a PC formed by the calculated longest path and said removed back edge is present if the longest path length exceeds the weight of said removed back edge.

10. the method of claim 7 wherein said PC detecting step calculates path information including the longest path and longest path length according to the number of back edges contained in the subgraph.

11. A constraint condition evaluation system comprising:
  A. means for disassembling a constraint graph having a plurality of cycles into a plurality of subgraphs while retaining the cycles in the constraint graph;
  B. means for detecting back edges in each subgraph; and
  C. means for detecting positive cycles (PCs) associated with the back edges in each subgraph, wherein said PC detecting means further includes:

a. means for removing the detected back edge from the subgraph:
b. means for calculating if possible, specific path information including the longest path and the longest path length with a first point and the second point of the removed back edge, wherein, during calculation of said longest path and longest path length, with the source in a subgraph as a base vertex, said calculating means further includes:
   i. means for setting a vertex other than the source to a value equal to or smaller than that of said base vertex;
   ii. means for sequentially selecting the position of each vertex as the base vertex according to a sort sequence;
   iii. means for adding to the position of each non-base vertex the weight of an edge from the vertex to the base vertex to generate an addition value; and
   iv. means for replacing the position of the base vertex, when an addition value exceeds the base vertex position, with said addition value and moves the base vertex position; and
c. means for determining whether a PC is present or not in said subgraph if the longest path length is calculated based on said calculating means.

12. The constraint condition evaluation system of claim 11 wherein, when said longest path cannot be calculated, said back edge detecting means and PC detecting means are repeatedly applied for the subgraph.

13. The constraint condition evaluation system of claim 11, wherein said PC detecting means further includes:
   means for calculating, if possible, the longest path and longest path length; and
   means for determining that a PC is not present in said subgraph if the longest path length does not exceed the weight of said removed back edge; and
   means for determining that a PC formed by the calculated longest path and said removed back edge is present if the longest path length exceeds the weight of said removed back edge.

14. The constraint condition evaluation system of claim 11 wherein said PC detecting means calculates path information including the longest path and longest path length according to the number of back edges contained in the subgraph.

15. The constraint condition evaluation system of claim 11 wherein said PC detecting means are repeated when:
   the vertexes do not move after the PC detecting means are performed more times than the number of vertexes in a subgraph, a difference between the sink position and the source position is used as the longest path length and, a path composed only of those edges, from those between the source and the sink, whose weight matches the distance between the initial vertex and the terminal vertex of the edge is used as the longest path; and
   it is determined that the longest path length is not found when the vertexes move after the PC detecting means are repeatedly applied more times than the number of vertexes in a subgraph.

16. The constraint condition evaluation system of claim 11 wherein a value of source position plus the minimum of the back edge weights is used as a value equal to or less than the position of said base vertex.

17. A constraint condition evaluation system comprising:
A. means for disassembling a constraint graph having a plurality of cycles into a plurality of subgraphs while retaining the cycles in the constraint graph;
B. means for detecting back edges in each subgraph; and
C. means for detecting positive cycles (PCs) associated with the back edges in each subgraph, wherein said PC detecting means further includes:
   a. means for removing the detected back edge from the subgraph;
   b. means for calculating, if possible, specific path information including the longest path and the longest path length with a first point and the second point of the removed back edge; and
   c. means for determining whether a PC is present or not in said subgraph if the longest path length is calculated based on said calculating means;
   d. means for obtaining a forward graph from which a back edge has been removed from a constraint graph;
   e. means for topological-sorting the vertexes in the forward graph;
   f. means for setting, with the source as a base vertex, the non-source vertexes in a forward graph to a value equal to or less than said base vertex;
   g. means for adjusting the positions of each two vertexes with a connecting edge in a sorted forward graph so that at least a positional interval for the weight of the edge is reserved between them;
   h. means for adding the weight of each removed back edge to the initial vertex of the back edge and, if the terminal vertex of the back edge is less than this addition value, for replacing the terminal vertex with the addition value, wherein the adjusting means sequentially selects the position of each vertex as the base vertex according to the topological-sorting means, adds to the position of each non-base vertex the weight of an edge from the vertex to the base vertex to generate an addition value, and replaces the position of the base vertex, when an addition value is larger than the base vertex position, with said addition value and moves the base vertex position, and, repeats the adjusting means and the adding means, times equal to the number of back edges, then the adjusting means and adding means are terminated by returning a failure of the longest path calculation when the adjusting means and adding means have not converged, and, the longest path length and the longest path are returned when the adjusting means and adding means have converged.

18. The constraint condition evaluation system of claim 17 wherein, when said longest path cannot be calculated, said back edge detecting means and PC detecting means are repeatedly applied for the subgraph.

19. The constraint condition evaluation system of claim 17 wherein said PC detecting means further includes:
   means for calculating, if possible, the longest path and longest path length; and
   means for determining that a PC is not present in said subgraph if the longest path length does not exceed the weight of said removed back edge; and
   means for determining that a PC formed by the calculated longest path and said removed back edge is present if the longest path length exceeds the weight of said removed back edge.

20. The constraint condition evaluation system of claim 17 wherein said PC detecting means calculates path information including the longest path and longest path length according to the number of back edges contained in the subgraph.

21. The method of claims 2, 1, 7, or 8 wherein, when said longest path cannot be calculated, said disassembling step is repeatedly applied.

22. The method of claims 2, 3, 4, 1, 7, 8, 9, or 10 wherein said disassembling step disassembles said constraint graph into strongly-connected components.

23. The method of claims 2, 3, 4, 1, 7, 8, 9, or 10 wherein said back edge detecting step detects a back edge in said subgraph containing a plurality of vertexes.

24. The method of claims 1 or 7 wherein said back edge detecting step selects, as a back edge, an edge whose terminal vertex position is smallest from those edges whose initial vertex position is largest in the subgraph.

25. The constraint condition evaluation system of claims 12, 11, 17, or 18, wherein, when said longest path cannot be calculated, said disassembling means is repeatedly applied.

26. The constraint condition evaluation system of claims 12, 13, 14, 11, 17, 18, 19, 20 wherein said disassembling means disassembles said constraint graph into strongly-connected components.

27. The constraint condition evaluation system of claims 12, 13, 14, 11, 17, 18, 19, or 20 wherein said back edge detecting means detects a back edge in said subgraph containing a plurality of vertexes.

28. The constraint condition evaluation system of claims 11, or 17 wherein said back edge detecting means selects, as a back edge, an edge whose terminal vertex position is smallest from those edges whose initial vertex position is largest in the subgraph.

* * * * *

UNITED STATES PATENT AND TRADEMARK OFFICE
CERTIFICATE OF CORRECTION

PATENT NO. : 5,971,596
DATED : October 26, 1999
INVENTOR(S) : Takeichiro NISHIKAWA It is certified that error appears in the above-identified patent and that said Letters Patent is hereby corrected as shown below:

On the Title Page, Item [57], in the Abstract, line 1, after "invention", delete "is".

In Claim 5, column 19, line 38, "claim 10" should read --claim 1--.

In Claim 6, column 19, line 53, "claim 10" should read --claim 1--.

In Claim 11, column 21, line 3, after "calculating", insert --,--.

In Claim 26, column 24, line 2, after "19,", insert --or--.

In Claim 28, column 24, line 11, after "11", delete ",".

Signed and Sealed this

Seventeenth Day of April, 2001

Attest:

NICHOLAS P. GODICI

*Attesting Officer*    *Acting Director of the United States Patent and Trademark Office*